US012586631B2

(12) United States Patent
Jang et al.

(10) Patent No.: US 12,586,631 B2
(45) Date of Patent: Mar. 24, 2026

(54) MEMORY DEVICE HAVING LOAD OFFSET MISMATCH COMPENSATION

(71) Applicant: SAMSUNG ELECTRONICS CO., LTD., Suwon-si (KR)

(72) Inventors: Mi Ji Jang, Suwon-si (KR); Young Hun Seo, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 184 days.

(21) Appl. No.: 18/372,118

(22) Filed: Sep. 24, 2023

(65) Prior Publication Data

US 2024/0177765 A1      May 30, 2024

(30) Foreign Application Priority Data

Nov. 30, 2022    (KR) ......................... 10-2022-0164498

(51) Int. Cl.
G11C 11/4091 (2006.01)
(52) U.S. Cl.
CPC ................................. G11C 11/4091 (2013.01)
(58) Field of Classification Search
CPC ................................................... G11C 11/4091

USPC ......................................................... 365/207
See application file for complete search history.

(56) References Cited

U.S. PATENT DOCUMENTS

| | | | |
|---|---|---|---|
| 10,074,408 B2 * | 9/2018 | Seo ..................... | G11C 11/4091 |
| 10,224,093 B2 | 3/2019 | Kim et al. | |
| 10,269,410 B2 | 4/2019 | Won et al. | |
| 10,950,279 B2 * | 3/2021 | Jeong .................... | H03F 1/0205 |
| 11,956,376 B2 * | 4/2024 | Kim ...................... | H04L 9/0822 |
| 2018/0233192 A1 * | 8/2018 | Won .................... | G11C 11/4097 |
| 2022/0013152 A1 | 1/2022 | Cao et al. | |
| 2022/0076732 A1 | 3/2022 | Kang et al. | |
| 2022/0157351 A1 | 5/2022 | Lin et al. | |

* cited by examiner

*Primary Examiner* — Anthan Tran
(74) *Attorney, Agent, or Firm* — Fish & Richardson P.C.

(57) ABSTRACT

A memory device including a memory cell array which includes a plurality of memory cells connected to each of a plurality of bit lines and word lines, a first bit line sense amplifier electrically connected to a first bit line through a first memory cell and a first connecting wiring and a second bit line sense amplifier electrically connected to a second bit line through a second connecting wiring having a length different from that of the first connecting wiring. A first compensation load of the first bit line and a second compensation load of the second bit line are adjusted to equalize RC loads of the first bit line and the second bit line.

12 Claims, 17 Drawing Sheets

| Region | TA | TB | TC | TD |
|---|---|---|---|---|
| Woc1 (Roc1) | Woc (40kohm) | Woc (40kohm) | Woc (40kohm) | Woc (40kohm) |
| Woc2 (Roc2) | Woc (40kohm) | 1.3*Woc (30kohm) | 2*Woc (20kohm) | 4*Woc (10kohm) |

TA                TB                TC                      TD

Woc=1a          Woc=1.3a          Woc=2a              Woc=4a
Loc=1b          Loc=1b            Loc=1b              Loc=1b

| Region | TA | TB | TC | TD |
|---|---|---|---|---|
| Loc1 (Roc1) | 4*Loc (40kohm) | 4*Loc (40kohm) | 4*Loc (40kohm) | 4*Loc (40kohm) |
| Loc2 (Roc2) | 4*Loc (40kohm) | 3*Loc (30kohm) | 2*Loc (20kohm) | Loc (10kohm) |

| Region | TA | TB | TC | TD |
|---|---|---|---|---|
| Loc1/Woc1 (Roc1) | 2*Loc/Woc (40kohm) | 2*Loc/Woc (40kohm) | 2*Loc/Woc (40kohm) | 2*Loc/Woc (40kohm) |
| Loc2/Woc2 (Roc2) | 2*Loc/Woc (40kohm) | Loc/0.8*Woc (30kohm) | Loc/Woc (20kohm) | Loc/2*Woc (10kohm) |

| TA | TB | TC | TD |
|---|---|---|---|
| Woc=1a Loc=2b | Woc=0.8a Loc=1b | Woc=1a Loc=1b | Woc=2a Loc=1b |

FIG. 12

| Region | TD |
|---|---|
| Wsw1 (Rsw1) | Wsw (30kohm) |

FIG. 13

| Region | TA | TB | TC |
|---|---|---|---|
| Wsw1 (Rsw1) | Wsw (30kohm) | Wsw (30kohm) | Wsw (30kohm) |
| Wsw2 (Rsw2) | Wsw (30kohm) | 1.5*Wsw (20kohm) | 3*Wsw (10kohm) |

FIG. 14

| Region | TA | TB | TC |
|---|---|---|---|
| Lsw1 (Rsw1) | 3*Lsw (30kohm) | 3*Lsw (30kohm) | 3*Lsw (30kohm) |
| Lsw2 (Rsw2) | 3*Lsw (30kohm) | 2*Lsw (20kohm) | Lsw (10kohm) |

| Region | TA | TB | TC |
|---|---|---|---|
| Lsw1/Wsw1 (Rsw1) | 3*Lsw/Wsw (30kohm) | 3*Lsw/Wsw (30kohm) | 3*Lsw/Wsw (30kohm) |
| Lsw2/Wsw2 (Rsw2) | 1.5*Lsw/0.5*Wsw (30kohm) | 1.5*Lsw/0.75*Wsw (20kohm) | Lsw/Wsw (10kohm) |

| Region | TA | TB | TC |
|---|---|---|---|
| Vbias1 (Rsw1) | Vbias (30kohm) | Vbias (30kohm) | Vbias (30kohm) |
| Vbias2 (Rsw2) | Vbias (30kohm) | 0.7*Vbias (20kohm) | 0.5*Vbias (10kohm) |

FIG. 19

| Region | TD |
|---|---|
| Wsw1 (Rsw1) | Wsw (30kohm) |

FIG. 20

| Region | TA | TB | TC |
|---|---|---|---|
| Wsw1 (Rsw1) | Wsw (30kohm) | Wsw (30kohm) | Wsw (30kohm) |
| Wsw2 (Rsw2) | Wsw (30kohm) | 1.5*Wsw (20kohm) | 3*Wsw (10kohm) |

FIG. 21

| Region | TA | TB | TC |
|---|---|---|---|
| Lsw1 (Rsw1) | 3*Lsw (30kohm) | 3*Lsw (30kohm) | 3*Lsw (30kohm) |
| Lsw2 (Rsw2) | 3*Lsw (30kohm) | 2*Lsw (20kohm) | Lsw (10kohm) |

FIG. 22

| Region | TA | TB | TC |
|---|---|---|---|
| Lsw1/Wsw1 (Rsw1) | 3*Lsw/Wsw (30kohm) | 3*Lsw/Wsw (30kohm) | 3*Lsw/Wsw (30kohm) |
| Lsw2/Wsw2 (Rsw2) | 1.5*Lsw/0.5*Wsw (30kohm) | 1.5*Lsw/0.75*Wsw (20kohm) | Lsw/Wsw (10kohm) |

FIG. 23

| Region | TA | TB | TC |
|---|---|---|---|
| Vbias1 (Rsw1) | Vbias (30kohm) | Vbias (30kohm) | Vbias (30kohm) |
| Vbias2 (Rsw2) | Vbias (30kohm) | 0.7*Vbias (20kohm) | 0.5*Vbias (10kohm) |

MEMORY DEVICE HAVING LOAD OFFSET MISMATCH COMPENSATION

CROSS-REFERENCE TO RELATED APPLICATION(S)

This application is based on and claims priority to Korean Patent Application No. 10-2022-0164498, filed on Nov. 30, 2022, in the Korean Intellectual Property Office, the disclosure of which is incorporated by reference herein.

BACKGROUND

The present disclosure relates to memory devices, and more particularly to memory devices including bit line sense amplifiers.

Semiconductor memory devices including RAM (Random Access Memory), which is volatile memory, are mainly used as main memory devices of a computer. For example, DRAM (Dynamic Random Access Memory) is a type of volatile RAM made up of memory cells. In order to efficiently sense data stored in the memory cells, a bit line and a complementary bit line are pre-charged with a pre-charge voltage, and then a charge sharing operation is performed to generate a difference between a voltage level of the bit line and a voltage level of the complementary bit line. A bit line sense amplifier senses data stored in a memory cell by amplifying the aforementioned input voltage difference, that is a voltage difference (dVBL) between the bit line and the complementary bit line.

Recently, with the development of the electronic industry, there has been increasing demand for high functionality, high speed, and small sized electronic components. Accordingly, to improve the degree of integration of semiconductor memory devices, great effort has been made toward reducing area of the memory cell region, reducing area of peripheral circuitry that is placed adjacent to the memory cell region for driving the memory cells, and increasing the amount of data processing units to speed up data processing.

Bit line sense amplifiers may sense and amplify an amount of voltage change of a memory cell. Bit line sense amplifiers typically perform an offset-cancelling operation, a charge-sharing operation, a charge-transfer operation, a sensing operation, and a restore operation, and the offset-cancelling operation is susceptible to affects due to load offset depending on positions of the bit line/complementary bit lines.

SUMMARY

Embodiments of the inventive concepts provide a memory device capable of improving element performance and reliability, and that may evenly adjust a load offset mismatch between the bit lines in a bit line sense amplifier.

Embodiments of the inventive concepts provide a memory device having a memory cell array which includes a plurality of memory cells connected to a plurality of bit lines and word lines; a first bit line sense amplifier electrically connected to a first memory cell from among the plurality of memory cells through a first bit line from among the plurality of bot lines and a first connecting wiring having a first length; a first offset compensation transistor electrically connected to the first bit line and the first bit line sense amplifier; a second bit line sense amplifier electrically connected to a second memory cell from among the plurality of memory cells through a second bit line from among the plurality of bit lines and a second connecting wiring having a second length different from the first length; and a second offset compensation transistor electrically connected to the second bit line and the second bit line sense amplifier. The first bit line includes a first compensation load and the second bit line includes a second compensation load to equalize RC loads of the first bit line and the second bit line.

Embodiments of the inventive concepts further provide a memory device having a memory cell array including a first memory cell connected between a first bit line node and a first complementary bit line node, and a second memory cell connected between a second bit line node and a second complementary bit line node; a first bit line sense amplifier including a first offset compensation transistor connected between the first bit line node and a first sensing bit line node, and a first complementary offset compensation transistor connected between the first complementary bit line node and a first sensing complementary bit line node; and a second bit line sense amplifier including a second offset compensation transistor connected between the second bit line node and a second sensing bit line node, and a second complementary offset compensation transistor connected between the second complementary bit line node and a second sensing complementary bit line transistor. A first length of a first connecting wiring connecting the first bit line node and one end of the first offset compensation transistor is different from a second length of a second connecting wiring connecting the second bit line node and one end of the second offset compensation transistor. The first bit line includes a first compensation load of the first connecting wiring and the second bit line includes a second compensation load of the second connecting wiring to equalize RC loads of the first connecting wiring and the second connecting wiring.

Embodiments of the inventive concepts still further provide a memory device including a memory cell array on a first layer, and including a plurality of memory cells connected between a plurality of bit lines and a plurality of complementary bit lines that are paired; a first offset compensation transistor on a second layer spaced below the first layer, and having one end connected to a first sensing bit line node and an other end connected to a first bit line from among the plurality of bit lines through a first connecting wiring; a first complementary offset compensation transistor on the second layer, and having one end connected to a first complementary sensing bit line node and an other end connected to a first complementary bit line from among the plurality of complementary bit lines through a first complementary connecting wiring having a same length as the first connecting wiring; a second offset compensation transistor on the second layer, and having one end connected to a second sensing bit line node and an other end connected to a second bit line from among the plurality of bit lines through a second connecting wiring having a length different than a length of the first connecting wiring; and a second complementary offset compensation transistor on the second layer, and having one end connected to a second complementary sensing bit line node and an other end connected to a second complementary bit line from among the plurality of complementary bit lines through a second complementary wiring having a same length as the second connecting wiring. One of channel length and channel width of the first offset compensation transistor, or one of channel lengths and channel widths of the second offset compensation transistor and the second complementary offset compensation transistor are set to adjust a first compensation load for the first connecting wiring, and a second compensation load for the second connecting wiring and the second complementary connecting wiring, based on a length ratio of the first connecting wiring and the second connecting wiring.

BRIEF DESCRIPTION OF THE DRAWINGS

The above and other aspects, features and advantages of the inventive concepts will be more clearly understood from the following detailed description taken in conjunction with the accompanying drawings, in which:

FIGS. 12 and 13 illustrate tables explanatory of channel width of a switch transistor included in the bit line sense amplifier according to embodiments of the inventive concepts.

FIG. 14 illustrates a table explanatory of channel length of the switch transistor included in the bit line sense amplifier according to embodiments of the inventive concepts.

FIGS. 19 and 20 illustrate tables explanatory of a channel width of a compensation transistor included in the bit line sense amplifier according to embodiments of the inventive concepts.

FIG. 21 illustrates a table explanatory of a channel length of the compensation transistor included in the bit line sense amplifier according to embodiments of the inventive concepts.

FIG. 22 illustrates a table explanatory of a ratio of the channel length to the channel width of the switch transistor included in the bit line sense amplifier according to embodiments of the inventive concepts.

FIG. 23 illustrates a table explanatory of gate bias settings of a switch transistor included in the bit line sense amplifier according to embodiments of the inventive concepts.

DETAILED DESCRIPTION OF THE EMBODIMENTS

Hereinafter, various embodiments will be described with reference to the accompanying drawings. Embodiments may be described and illustrated in terms of blocks which carry out a described function or functions. These blocks, which may be referred to herein as units or modules or the like, are physically and/or electrically implemented by analog and/or digital circuits such as logic gates, integrated circuits, microprocessors, microcontrollers, memory circuits, passive electronic components, active electronic components, optical components, hardwired circuits and the like, and may be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
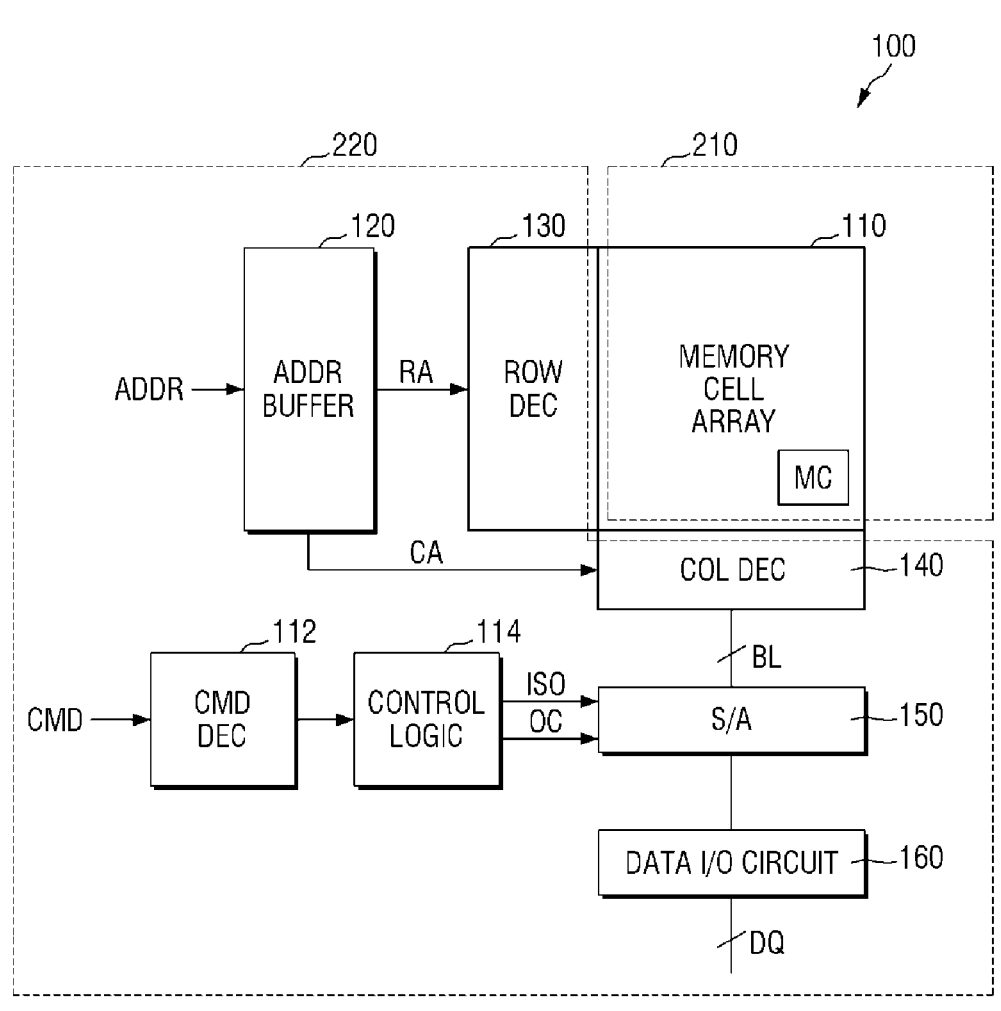
FIG. 1 illustrates a diagram of a memory device according to embodiments of the inventive concepts.

FIG. 1 illustrates a diagram of a memory device according to embodiments of the inventive concepts.

Referring to FIG. 1, a memory device 100 may be a storage device based on a semiconductor element. For example, the memory device 100 may include DRAM (Dynamic Random Access Memory) such as a DDR SDRAM (Double Data Rate Static DRAM), a SDR SDRAM (Single Data Rate SDRAM), a LPDDR SDRAM (Low Power DDR SDRAM), a LPSDR SDRAM (Low Power SDR SDRAM), and a Direct RDRAM (Rambus DRAM), or may be an arbitrary volatile memory device. In particular, the memory device 100 may be a device to which standard conventions such as DDR4 or DDR5 are applied.

In an embodiment, the number of data pins to which the DDR4 or DDR5 standard conventions are applied may be four, eight or sixteen, and the number of data pins of the semiconductor memory device 100 according to the inventive concepts may be sixteen. The description of the number of data pins of the memory system 50 and the like used in the description herein below may be applied according to the standard conventions of dynamic random access memory, but is not necessarily limited thereto.

The memory device 100 may output data through data lines DQ in response to command CMD, address ADDR, and control signals received from an external device, for example, a memory controller. The memory device 100 includes a memory cell array 110, a command decoder 112, a control logic (e.g., circuit) 114, an address buffer 120, a row decoder 130, a column decoder 140, a sense amplifier array (S/A) 150, and a data input/output (I/O) circuit 160.

The memory cell array 110 includes a plurality of memory cells (MC) provided in the form of a matrix arranged in rows and columns. The memory cell array 110 includes a plurality of word lines and a plurality of bit lines BL connected to the memory cells. The plurality of word lines may be connected to rows of the memory cells, and a plurality of bit lines BL may be connected to columns of the memory cells.

According to some embodiments, the memory cells may include a normal memory cell and a redundant memory cell that store data. The redundant memory cell is used to relieve a defective normal memory cell when the normal memory cell becomes defective.

The command decoder 112 decodes the command CMD received from the memory controller, which may be for example, a write enable signal (/WE), a row address strobe signal (/RAS), a column address strobe signal (/CAS), a chip select signal (/CS), and the like. The command CMD may include an active command, a read command, a write command, a pre-charge command, and the like.

The control logic 114 may generate various control signals necessary for access operation to the memory cell array 110, for example, the write operation, the read operation, the pre-charge operation, and the like, in response to the decoded command.

The address buffer 120 receives the address ADDR from a memory controller, which is an external device. The address ADDR includes a row address RA for addressing a row of the memory cell array 110, and a column address CA for addressing a column of the memory cell array 110. The address buffer 120 may transmit the row address RA to the row decoder 130, and transmit the column address CA to the column decoder 140.

The row decoder 130 may select any one of a plurality of word lines WL connected to the memory cell array 110. The row decoder 130 may decode the row address RA received from the address buffer 120, select any one word line corresponding to the row address RA, and activate the selected word line. A high power supply voltage VPP higher than a power supply voltage VDD may be applied to a gate of an access transistor of the memory cell, at the time of activation of the word line, that is, the word line enable operation.

The column decoder 140 may select a predetermined bit line among the plurality of bit lines BL of the memory cell array 110. The column decoder 140 may decode the column address CA received from the address buffer 120 to select a predetermined bit line BL corresponding to the column address CA.

The sense amplifier array (S/A) 150 is connected to bit lines BL of the memory cell array 110. The sense amplifier array 150 senses a voltage change of a bit line selected among the plurality of bit lines BL, amplifies the voltage, and outputs the amplified voltage.

The data input/output circuit 160 may output data, which is output on the basis of voltage sensed and amplified by the sense amplifier array 150, to outside through the data lines DQ. An arbitrary bit line sense amplifier BLSA in the sense amplifier array 150 may be connected to a bit line pair consisting of the first bit line BL and the complementary bit line BLB of the first bit line BL to sense and amplify the potential appearing on the bit lines. A specific connection between the bit line sense amplifier and the bit line pair will be described hereinafter with respect to FIG. 4.

The sense amplifier array 150 may receive an isolation signal ISO and an offset removal signal OC from the control logic 114. The sense amplifier array 150 may perform an offset removal operation according to the isolation signal ISO and the offset removal signal OC. As an example, the offset refers to a difference in characteristics between the semiconductor elements that make up the sense amplifier array 150, for example, threshold voltages.

Figure 2:
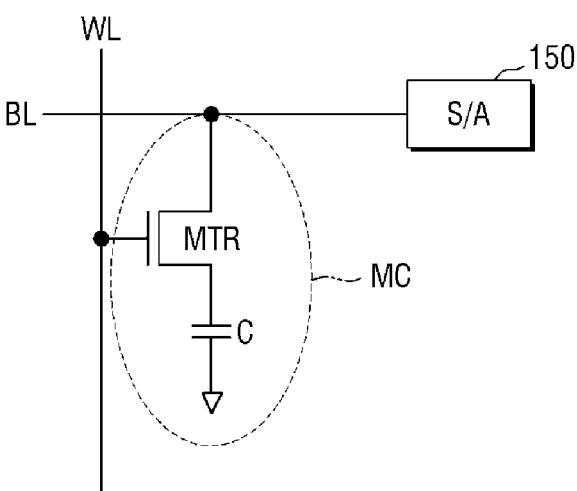
FIG. 2 illustrates a diagram of the memory cell of FIG. 1.

FIG. 2 illustrates a diagram explanatory of the memory cell of FIG. 1.

Referring to FIGS. 1 and 2, the memory cells MC included in the memory cell array are connected to each of the word lines WL and each of the bit lines BL. Although only the bit line BL is shown for convenience of explanation, the memory cell MC is connected to the bit line BL and the complementary bit line BLB.

The memory cell MC is made up of a cell transistor MTR and a cell capacitor C. The memory device 100 may perform a read operation or a refresh operation on the basis of the charge amount of the cell capacitor C included in the memory cell MC. For example, the first bit line BL connected to the memory cell MC is pre-charged with a pre-charge voltage Vpre. After that, as the word line WL is activated, a charge sharing operation between the charge of the first bit line BL charged with the pre-charge voltage Vpre and the charge of the cell capacitor C of the memory cell MC occurs. Due to the charge sharing operation, the voltage of the first bit line BL will decrease or increase by the voltage change amount V from the pre-charge voltage Vpre. Each sense amplifier of the sense amplifier array 150 may sense and amplify the voltage change amount V.

Figure 3:
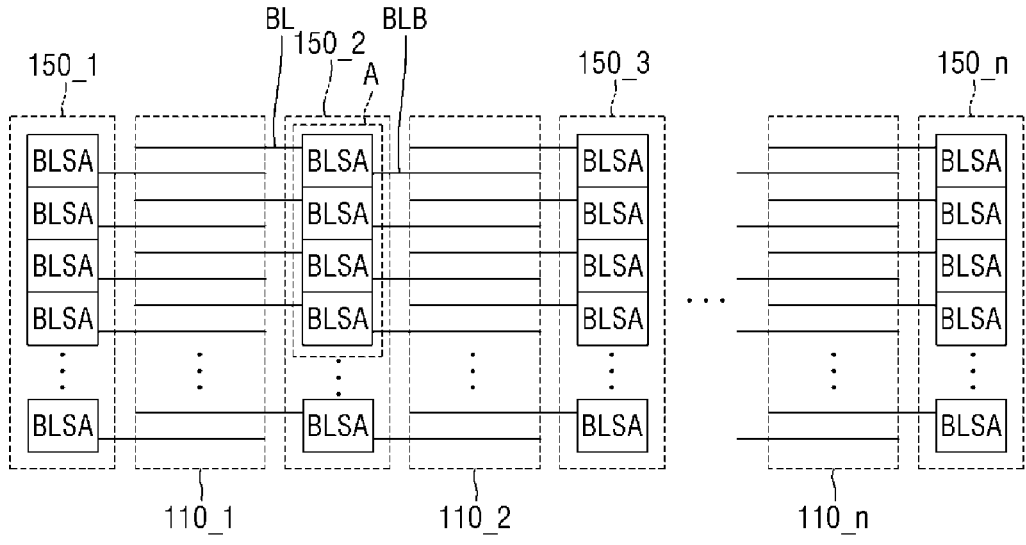
FIG. 3 illustrates a diagram of a memory cell array including bit line sense amplifiers according to embodiments of the inventive concepts.

FIG. 3 illustrates a diagram of a memory cell array to which the bit line sense amplifiers according to some embodiments are applied.

Referring to FIG. 3, the memory device 100 includes a plurality of memory cell arrays 110_1 to 110_n, and a plurality of bit line sense amplifiers 150_1 to 150_n.

Each of the plurality of bit line sense amplifiers 150_1 to 150_n may include a plurality of bit line sense amplifiers (hereafter, referred to as BLSA). The BLSAs may be implemented as the sense amplifier array 150 described with respect to FIGS. 1 to 3.

A plurality of bit line-complementary bit line pairs (BL-BLB pairs) connected to each of the plurality of memory cell arrays 110_1 to 110_n may be connected to each of a plurality of BLSAs. Each BLSA may be a cross-coupled differential sense amplifier implemented as a P-type sense amplifier and an N-type sense amplifier.

Each BLSA is a circuit element that normally operates at the time of operation of the semiconductor memory device, and is distinguished from dummy sense amplifiers 150-1 and 150-$n$ implemented in a region other than a region in which the bit line sense amplifiers 150_2 to 150_$n$–1 are implemented.

According to some embodiments, the odd bit lines of memory cell array 110_1 may be connected to the first bit line BL, and the even bit lines may be connected to complementary bit line BLB. A BLSA 150-2 may be bi-directionally connected to each of the bit line pairs BL and BLB. For example, the BLSA 150-2 is connected to odd-numbered bit lines (e.g., BL1, BL3, BL5, . . . etc.) of a left first memory cell array 110_1, that is, the bit line BL, and the bit line sense amplifier 150-2 may be connected to even-numbered bit lines (e.g., BL0, BL2, BL4, . . . etc.) of a right second memory cell array 110_2, that is, the complementary bit line BLB.

When the potential of the bit line BL is a high potential in the sensing operation of BLSA, the potential of the complementary bit line BLB becomes a low potential. On the other hand, when the potential of the bit line BL is a low potential in the sensing operation of BLSA, the potential of the complementary bit line BLB becomes a high potential.

Although not shown, the odd-numbered bit lines of the second memory cell array 110_2 may extend in a direction opposite to the BLSA 150-2 and be connected to the BLSA 150-3.

Although the BLSAs 150_1 to 150_$n$ are shown as flat surfaces in FIG. 3, this is for explaining the connections between the memory cell arrays 110_1, and 110_2 to 110_$n$ and the bit line BL or the complementary bit line BLB. According to various embodiments, the BLSA 150 may be placed on the same layer as the memory cell array 110, or according to other embodiments, the BLSA 150 may be placed on a different layer from the memory cell array 110 along with other logic circuits.

Figure 4:
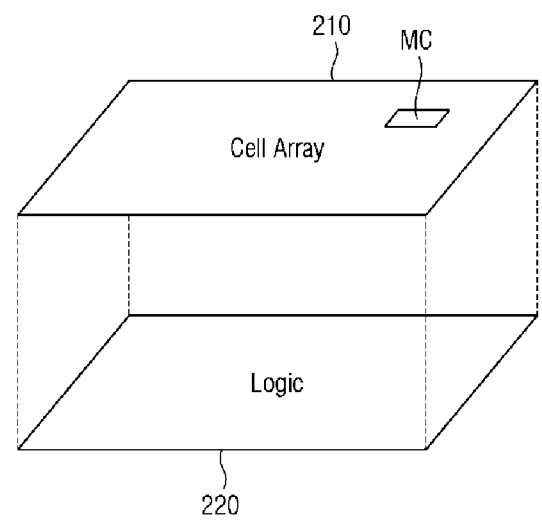
FIG. 4 illustrates a conceptual diagram of placement of the memory device according to embodiments of the inventive concepts.

FIG. 4 illustrates a conceptual diagram of a placement of the memory device according to some embodiments.

Referring to FIGS. 1 and 4, the memory device 100 according to some embodiments may be implemented on a plurality of layers. The first layer 210 and the second layer 220 may be flat surfaces that are vertically spaced apart and parallel to each other. For example, the first layer 210 may be a cell array layer, and the second layer 220 may be a logic layer.

According to an embodiment, the memory cell array 110 is placed on the first layer 210, and the peripheral circuits 120, 130, 140, 150, 160, 112, 114, and the like for driving the memory cell array 110 may be placed on the second layer 220.

Alternatively, according to an embodiment, the first layer 210 may be placed to include a memory cell array 110, a row decoder 130, and a column decoder 140, and the second layer 220 may be placed to include the remaining peripheral circuits 112, 114, 120, 150, and 160.

Alternatively, according to an embodiment, the command decoder 112 and the control logic 114 may be placed in separate layers, and the second layer 220 may include the remaining peripheral circuits 120, 130, 140, 150, and 160.

In the above embodiments, the memory cell MC of the first layer 210 is connected to the bit line BL and the complementary bit line BLB, and the bit line/complementary bit line BL/BLB is connected to the bit line sense amplifier 150 located on the second layer 220. However, a load offset of the bit line/complementary bit line BL/BLB may occur depending on the position of the memory cell.

Figure 5:
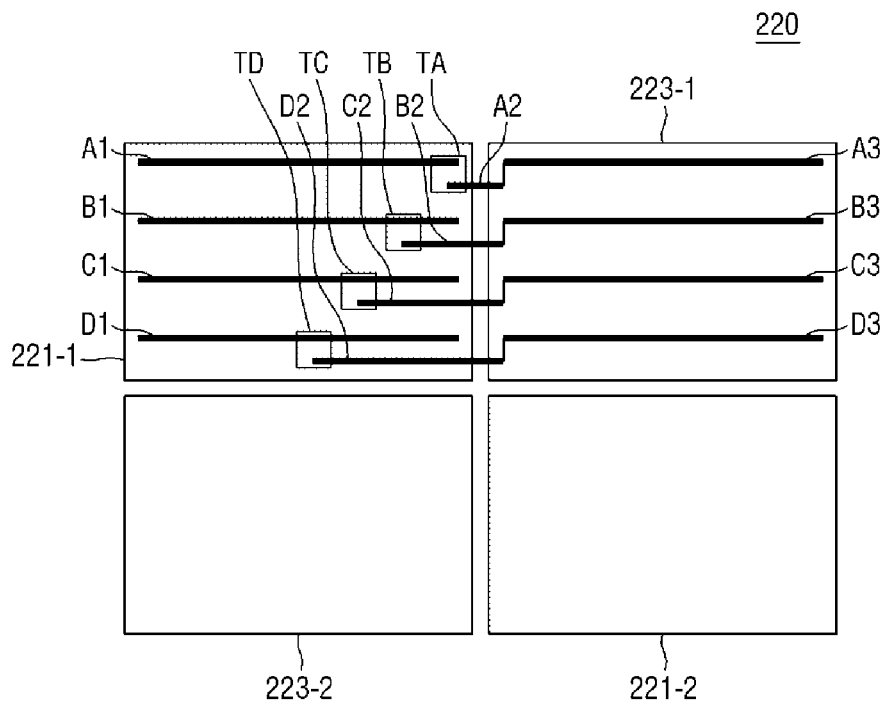
FIG. 5 illustrates a conceptual diagram explanatory of the second layer 220 of FIG. 4 according to embodiments of the inventive concepts.

FIG. 5 illustrates a conceptual diagram explanatory of the second layer 220 of FIG. 3 according to some embodiments. FIG. 5 may be characterized as a top plan view of the second layer 220 which is planar and extends along an X-direction and a Y-direction that is perpendicular to the X-direction.

Referring to FIGS. 1, 4 and 5, the second layer 220 may include peripheral circuits for driving the memory cell array 110.

According to some embodiments, the second layer 220 may include sense amplifier regions 221-1 and 221-2, and peripheral circuitry regions 223-1 and 223-2. A plurality of bit line sense amplifiers 150 connected to each of the bit line BL and the complementary bit line BLB to sense and amplify the voltage change amount of memory cell MC may be placed in the sense amplifier regions 222-1 and 221-2. The peripheral circuit regions 223-1 and 223-2 may include remaining peripheral circuit configurations (e.g., 120, 130, 140, 160, etc.) of the peripheral circuits of FIG. 1 other than the bit line sense amplifier.

According to some embodiments, the second layer 220 may include a plurality of sense amplifier regions 221-1 and 221-2, and a plurality of peripheral circuit regions 223-1 and 223-2. In the shown example, although the second layer 220 will be described as including two sense amplifier regions 221-1 and 221-2 and two peripheral circuit regions 223-1 and 223-2, the embodiments of the inventive concepts are not limited thereto.

The memory cell array of the first layer 210 may be placed by being divided into sub-arrays. For example, a first sub-array is placed at a position corresponding to the sense amplifier region 221-1 and the peripheral circuit region 223-1, and a second sub-array may be placed at a position corresponding to the sense amplifier region 221-2 and the peripheral circuit region 223-2.

The sense amplifier regions 221-1 and 221-2 and the peripheral circuit regions 223-1 and 223-2 may be placed point-symmetrically. For example, the sense amplifier region 221-1 and the peripheral circuit region 223-1 are placed in the first row, and the peripheral circuit region 223-2 and the sense amplifier region 221-2 may be placed in the second row. The sense amplifier regions 221-1 and 221-2 may be placed point-symmetrically to each other, and the peripheral circuit regions 223-1 and 223-2 may be placed point-symmetrically to each other.

The sense amplifier region 221-1 includes a plurality of connecting bit line wirings A1, B1, C1 and D1, and the connecting bit line wirings A1, B1, C1 and D1 are spaced apart from each other and placed parallel in the Y-direction, while extending in the X-direction. The peripheral circuit region 223-1 includes connecting signal wirings A3, B3, C3 and D3, and the connecting signal wirings A3, B3, C3 and D3 are spaced apart from each other and placed parallel in the Y-direction, while extending in the X-direction. According to some embodiments, the connecting bit line wiring and the connecting signal wiring may be placed on the same axis extending in the X-direction. For example, the connecting bit line wiring A1 and the connecting signal wiring A3 may be placed on a same X axis, while being spaced apart from each other.

The connecting regions TA, TB, TC, and TD include a plurality of through channels, and the through channels independently send the bit line/complementary bit line (BL/BLB) signal, the word line signal, the control signal, and the like.

The connecting regions TA, TB, TC, and TD may connect the connecting bit lines A1, B1, C1, and D1 and the bit line/complementary bit line BL/BLB of the memory cells of the first layer 210. The connecting regions TA, TB, TC, and TD may be connected to the connecting signal wirings A3, B3, C3, and D3 of the peripheral circuit region 223-1 through the connecting wirings A2, B2, C2, and D2.

The connecting regions TA, TB, TC, and TD may be placed inside the sense amplifier region 221-1 alternately both in the X-direction and the Y-direction. That is, they may be placed on different Y-axes in the Y-direction, while being placed on different X-axes in the X-direction. For example, the connecting regions TA, TB, TC, and TD may be placed diagonally from a planar viewpoint such that the connecting wirings A2, B2, C2, and D2 become increasingly longer or gradually shorter. Further, for example, the connecting regions TA, TB, TC, and TD may be placed in a U shape (or reversed U shape) from a planar viewpoint in which the connecting wirings A2, B2, C2, and D2 become longer and shorter, or become shorter and longer.

That is, the connecting bit line wirings A1, B1, C1, and D1 and the connecting wirings A3, B3, C3, and D3 have the same length in the respective regions 221-1 and 223-1, but the connecting wirings A2, B2, C2 and D2 have different wiring lengths corresponding to the connecting regions TA, TB, TC and TD. The bit line sense amplifiers 150 thus have a load offset corresponding to the lengths of the connecting wirings A2, B2, C2 and D2. The load offset means that an RC load (Resistive Capacitive Load, hereinafter an RC load) varies depending on the length of the connecting wiring connected between the bit line BL of the memory cell and a bit line sense amplifier 150, for example. In the shown example, the RC load of the connecting wiring A2 may have a different value from the RC load of the connecting wiring D2.

A RC load offset mismatch of the bit line/complementary bit line according to the length of the connecting wiring may affect the offset canceling operation of the bit line sense amplifier 150.

Figure 6:
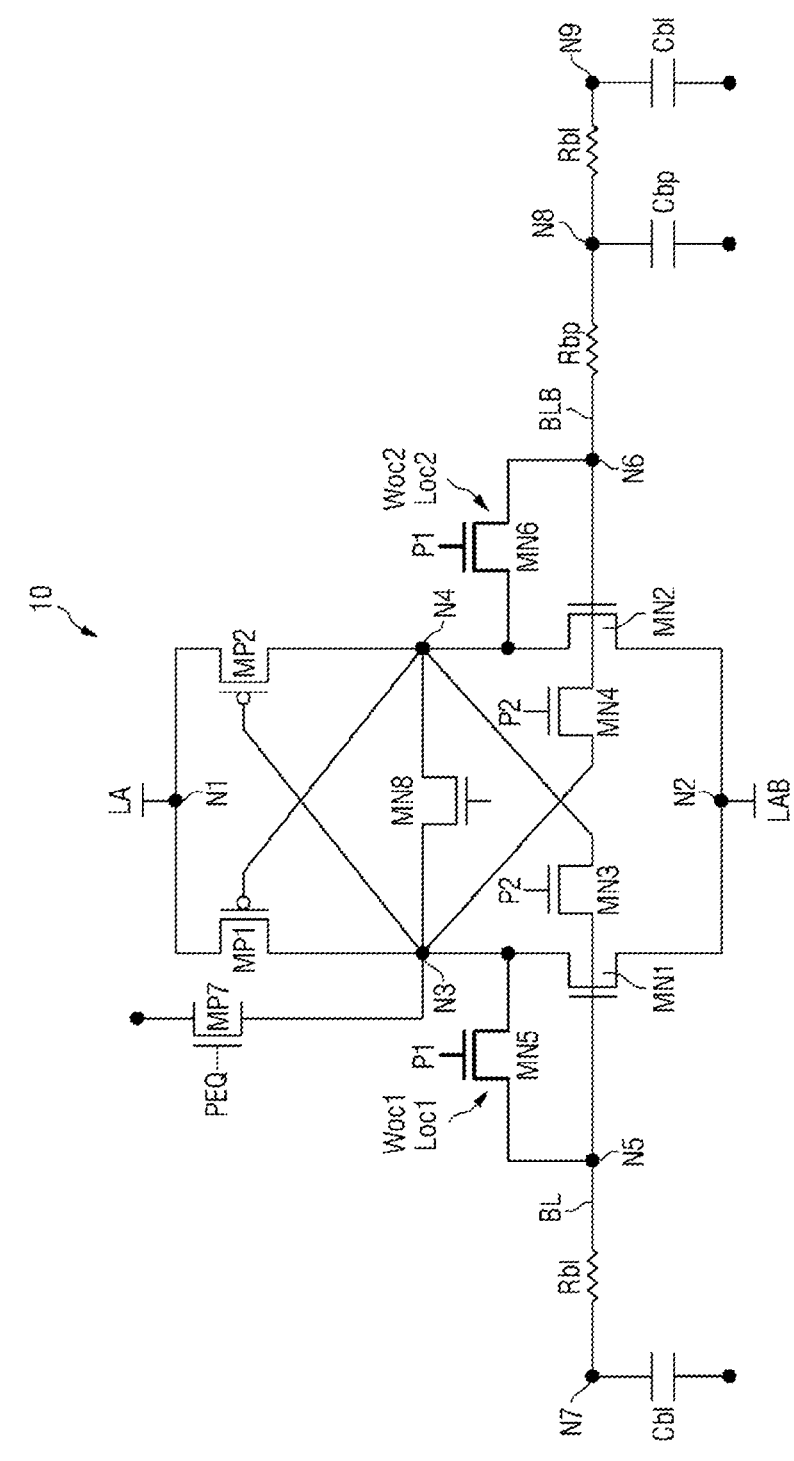
FIG. 6 illustrates a circuit diagram of a bit line sense amplifier according to embodiments of the inventive concepts.

FIG. 6 illustrates a circuit diagram of a bit line sense amplifier according to some embodiments. The bit line sense amplifier 10 of FIG. 6 may be an embodiment of the bit line sense amplifier 150 of FIG. 1.

Referring to FIG. 6, the BLSA 10 according to some embodiments may include amplification transistors MP1, MP2, MN1, and MN2, isolation transistors MN3 and MN4, offset compensation transistors MN5 and MN6, and an equalizing enable transistor MP7.

The amplification transistors MP1, MP2, MN1, and MN2 are connected between a first supply line (LA, N1) supplied with a first control signal LA and a second supply line (LAB, N2) supplied with a second control signal LAB. For example, a P-type amplification transistor MP1 and an N-type amplification transistor MN1 are connected in series between the first supply line N1 and the second supply line N2, and a P-type amplification transistor MP2 and an N-type amplification transistor MN2 are connected in series between the first supply line N1 and the second supply line N2. Drain terminals of the P-type amplification transistor MP1 and the N-type amplification transistor MN1 are commonly connected to a sensing bit line node N3, and drain terminals of the P-type amplification transistor MP2 and the N-type amplification transistor MN2 are commonly connected to a complementary sensing bit line node N4. The N3 node may be called a complementary sensing bit line node SBLB, and the N4 node may be called a sensing bit line node SBL.

The P-type transistor MP1 and the P-type transistor MP2 are cross-coupled, and gate terminals are connected to drain terminals (the gate of MP1 is connected to the N4 node, and the gate of MP2 is connected to the N3 node).

The N-type transistor MN1 and the N-type transistor MN2 are cross-coupled, and gate terminals are connected to drain terminals (the gate of MN1 is connected to the N4 node through N-type isolation transistor MN3, and the gate of MN2 is connected to the N3 node through N-type isolation transistor MN4). On the other hand, the gate of the N-type amplification transistor MN1 is connected to a bit line node N5 connected to the bit line BL of the memory cell, and the gate of the N-type amplification transistor MN2 is connected to a complementary bit line node N6 connected to a complementary bit line BLB of the memory cell.

The isolation transistor MN3 is connected between the N5 node and the N4 node to connect or disconnect the bit line BL and the sensing bit line SBL depending on the isolation control signal P2. The isolation transistor MN4 is connected between the N6 node and the N3 node to connect or disconnect the complementary bit line BLB and the complementary sensing bit line SBLB depending on the isolation control signal P2.

According to some embodiments, the BLSA 10 includes an equalizing enable transistor MP7. The equalizing enable transistor MP7 is connected to the sensing bit line node N3 according to the equalizing control signal PEQ, and pre-charges the sensing bit line SBL with an equalizing voltage.

According to some embodiments, the BLSA 10 includes offset compensation transistors MN5 and MN6. The offset compensation transistors MN5 and MN6 remove an offset generated between the bit line BL and the complementary sensing bit line SBLB, or between the complementary bit line BLB and the sensing bit line SBL. The offset compensation transistor is also called an offset removal transistor. The offset compensation transistor MN5 is connected between the bit line node N5 and the complementary sensing bit line node N3 to connect or disconnect the bit line BL and the complementary sensing bit line SBLB to each other depending on the offset control signal P1. The offset compensation transistor MN6 is connected between the complementary bit line node N6 and the sensing bit line node N4 to connect or disconnect the complementary bit line BLB and the sensing bit line SBL to each other depending on the offset control signal P1.

The BLSA 10 according to some embodiments may further include a level balancing transistor MN8. The level balancing transistor MN8 may be turned on during the pre-charge operation to set the node N3 and the node N4 to the same level so that a threshold voltage Vth difference between the transistors MP1 and MP2 does not occur in the pre-charge operation.

The bit line BL may have a parasitic resistance Rb1 and a parasitic capacitor Cb1 of the bit line itself. The parasitic resistance Rb1 and the parasitic capacitor Cb1 are depicted as connected to each other at node N7. The complementary bit line BLB may also have parasitic resistances Rb1 and Rbp and parasitic capacitors Cb1 and Cbp of the complementary bit line itself connected to nodes N8 and N9. However, as explained above, depending on the position of BLSA 10 on the layer 220, the lengths of the connecting wirings (A2, B2, C2, and D2 of FIG. 5) to the N5 and N6 nodes of the BLSA 10 vary (i.e., may be different). Accordingly, the RC loads (Rb1, Cb1) of the bit line BL itself and the RC loads (Rb1+Rbp, Cb1+Cbp) of the complementary bit line BLB itself may differ by an additional parasitic resistance Rbp and an additional parasitic capacitor Cbp depending on the connecting wiring length.

That is, the BLSA 10 may be connected by connecting wirings having lengths different from those of the memory cell array, on the bit line side and the complementary bit line side. For example, the bit line may be connected by a short connecting wiring and the complementary bit line may be connected by a long connecting wiring, or conversely, the bit line may be connected by a long connecting wiring and the complementary bit line may be connected by a short connecting wiring. When the connecting wirings of different lengths are connected to the bit line and the complementary bit line, the extent of a parasitic resistance or a parasitic capacitor may affect differential sensing of the BLSA 10.

Referring to FIG. 5, according to some embodiments, it is assumed that the bit lines BL (e.g., A1, B1, C1 and D1) have the same length, and the complementary bit lines BLB have different connecting wiring lengths for each region. It is assumed that among the plurality of BLSAs 10, the BLSA of the connecting region TA has the shortest connecting wiring length (e.g., A2), the BLSA of the connecting region TD has the longest connecting wiring length (e.g., D2), and the connecting wiring lengths increase at a rate of A2:B2: C2:D2=1:2:3:4. Accordingly, when there is no additional compensation load for each bit line, the RC load may increase in order of A2, B2, C2, and D2. In FIG. 6, it is assumed that the offset transistor MN5 included in the BLSA 10 has a channel width of Woc1 and a channel length of Loc1, and the offset transistor MN6 has a channel width of Woc2 and a channel length of Loc2. For convenience of explanation, although a case where the connecting wiring length of the complementary bit line BLB is different will be described, the embodiments of the inventive concepts may also be similarly applied to a case where the connecting wiring length of the bit line BL is different for each region.

The memory device may further include a compensation load for each BLSA 10 to prevent an RC load offset mismatch regardless of the position of the corresponding BSLA 10. A compensation load adjustment of the memory device according to various embodiments will described below with reference to FIGS. 7 to 26A. For example, a first bit line includes a first compensation load of the first connecting wiring and a second bit line includes a second compensation load of the second connecting wiring. The first compensation load and the second compensation load provide to remove a RC load offset to equalize RC loads of the first connecting wiring and the second connecting wiring.

Figure 7:
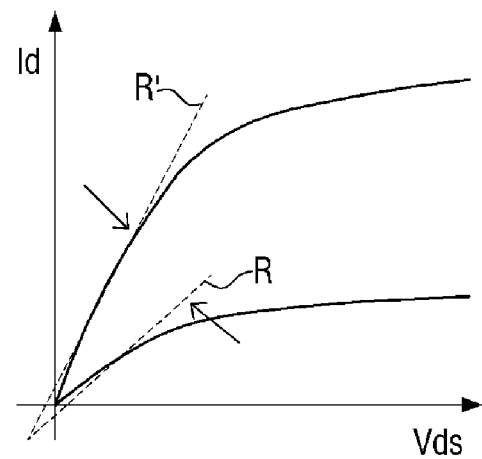
FIG. 7 illustrates a voltage-current graph explanatory of a turn-on resistance that varies depending on the channel length and channel width of a transistor.
Figure 8:
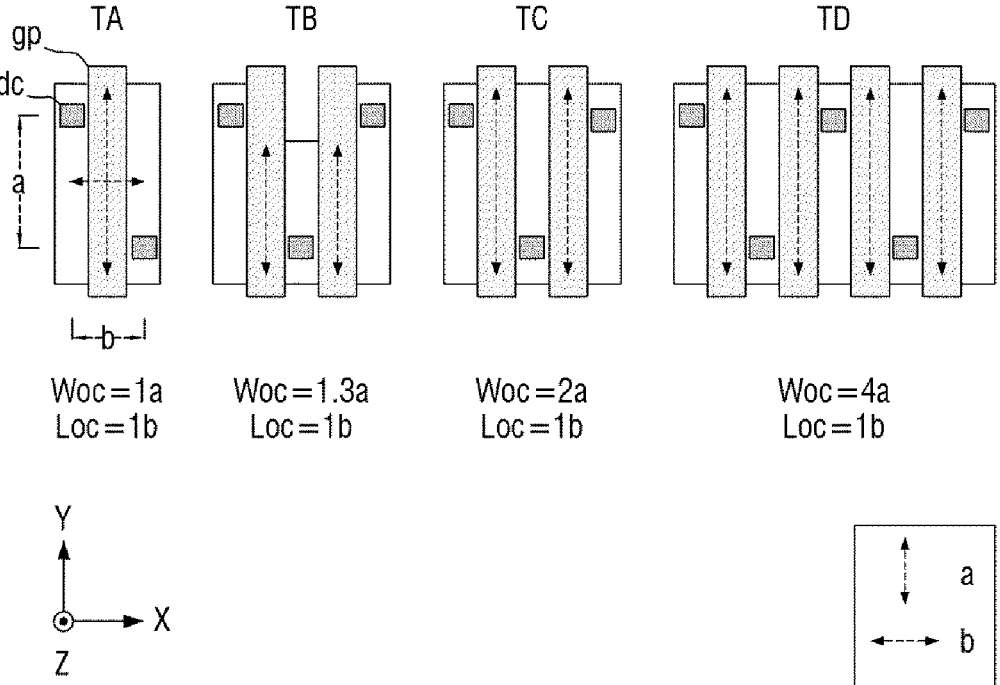
FIG. 8A illustrates a table explanatory of a channel width of an offset compensation transistor included in the bit line sense amplifier according to embodiments of the inventive concepts.
FIG. 8B illustrates a layout diagram of a channel of the offset compensation transistor MN6 in FIG. 6.
Figure 9:
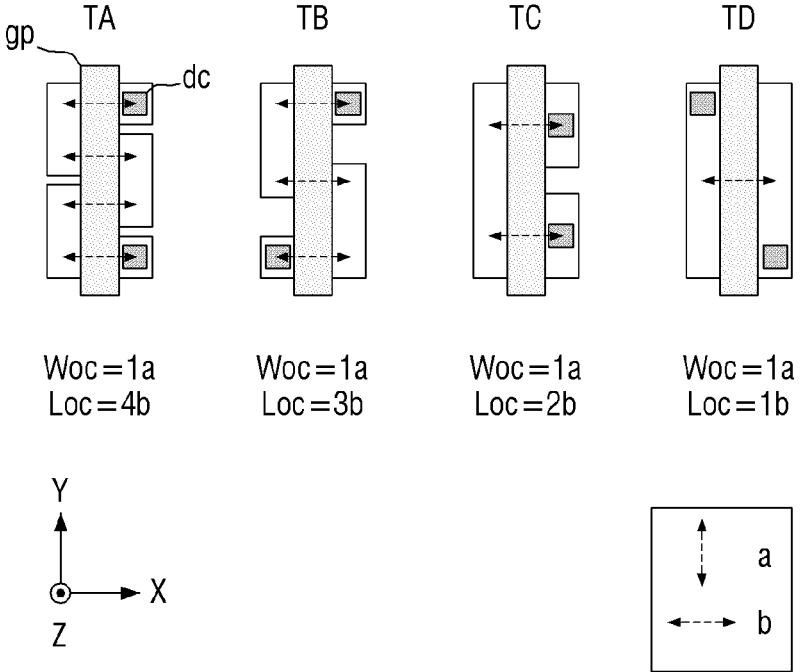
FIG. 9A illustrates a table explanatory of a channel length of an offset compensation transistor included in the bit line sense amplifier according to embodiments of the inventive concepts.
FIG. 9B illustrates a layout diagram of a channel of the offset compensation transistor MN6 in FIG. 6.
Figure 10:
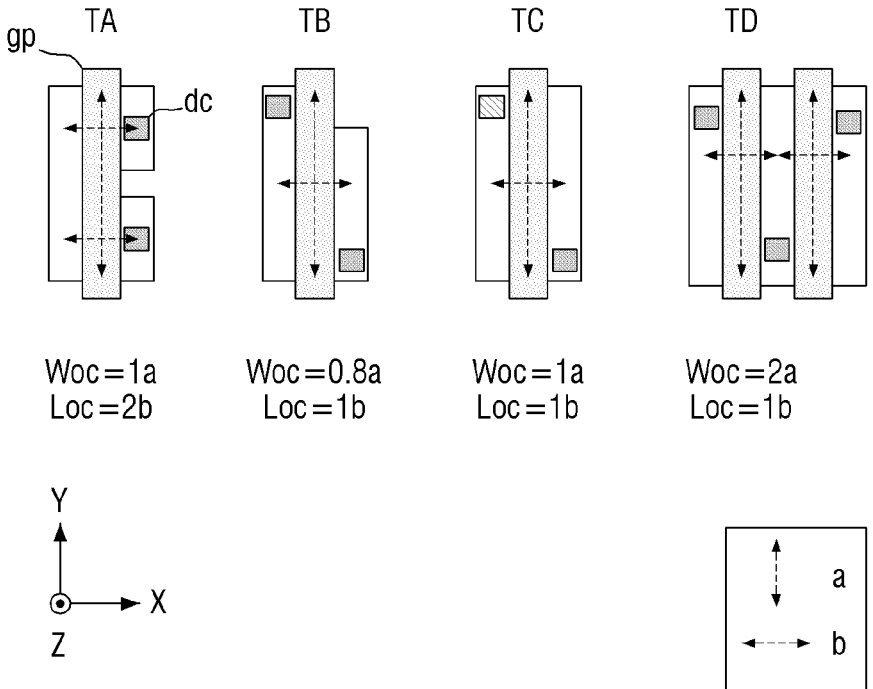
FIG. 10A illustrates a table explanatory of a channel length and a channel width adjusted for an offset compensation transistor included in the bit line sense amplifier according to embodiments of the inventive concepts.
FIG. 10B illustrates a layout diagram of a channel of the offset compensation transistor according to FIG. 10A.
Figure 11:
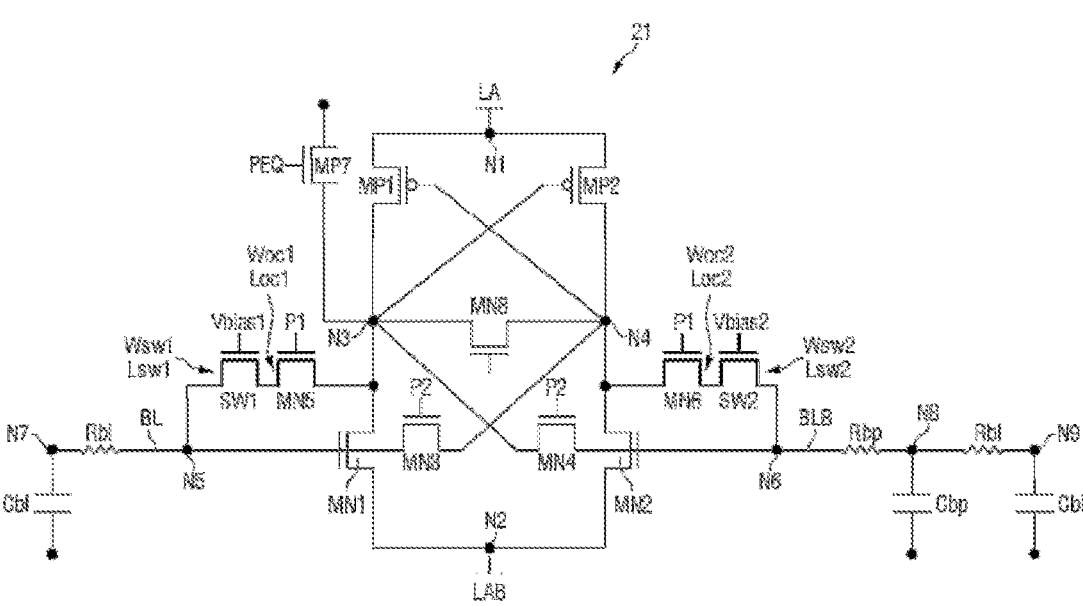
FIGS. 11A and 11B illustrate circuit diagrams of bit line sense amplifiers according to embodiments of the inventive concepts.
Figure 11:
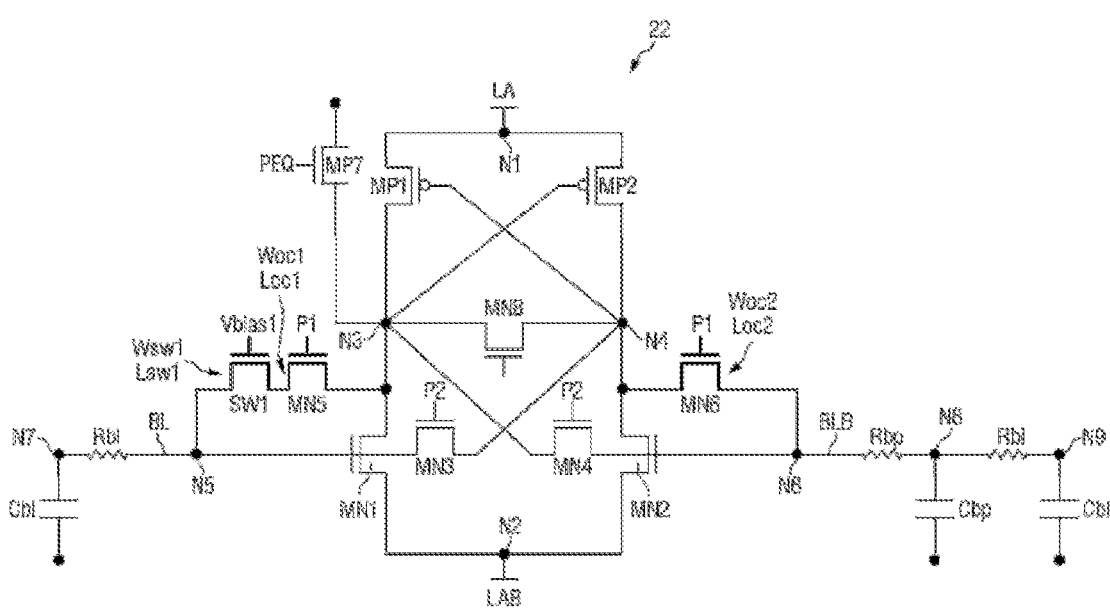

FIG. 7 illustrates a voltage-current graph explanatory of that a turn-on resistance varies depending on the channel length and channel width of a transistor. The horizontal X-axis represents drain-source voltage (Vds) of a transistor, and the vertical Y-axis represents drain current (Id) of the transistor.

Referring to FIG. 7, the transistor may be adjusted in channel width and/or channel length to adjust the turn-on resistance value. A turn-on resistance value R of a transistor is inversely proportional (i.e., R $\propto$L/A) to the channel cross-sectional area A, and proportional to the channel length L. Since the channel width W is proportional to the cross-sectional area, the turn-on resistance value is inversely proportional to the channel width. When adjusting the channel length of a transistor, adjusting the channel width, or adjusting the ratio of channel length to channel width at the time of designing a memory device according to such a relationship, a turn-on resistance value may be adjusted from R to R' according to the voltage-current graph of the transistor.

According to some embodiments, the turn-on resistance of the offset compensation transistors MN5 and MN6 of the memory device may be adjusted to adjust for the compensation load. For example, the compensation load may be adjusted by adjusting the channel widths, adjusting the channel length, or adjusting the ratio of channel width to channel length of the offset compensation transistors MN5 and MN6. FIGS. 8A to 10B are embodiments for adjusting the turn-on resistance of the offset compensation transistor.

FIG. 8A illustrates a table explanatory of a channel width of the offset compensation transistor included in the bit line sense amplifier according to some embodiments, and FIG. 8B illustrates a layout diagram that simply shows a channel of the offset compensation transistor (e.g., MN6 in FIGS. 6 and 8A).

For example, referring to FIGS. 5 to 8A, at the connecting regions TA, TB, TC and TD, the channel widths Woc1 of the offset compensation transistors MN5 of the BLSAs have a ratio of 1:1:1:1. That is, the channel width is Woc for the offset compensation transistors MN5 of the BLSA 10 in each of connecting region TA, connecting region TB, connecting region TC, and connecting region TD. Each of the offset compensation transistors MN5 of the BLSAs in connecting regions TA, TB, TC and TD have a 40 kohm turn-on resistance value (Roc1). That is, in this example embodiment, the offset compensation transistor MN5 of the BLSAs in each connecting region has the same channel width and the same turn-on resistance regardless of the BLSA position. On the other hand, in the connecting regions TA, TB, TC and TD, the channel widths Woc2 of the offset transistors MN6 of the BLSAs have a ratio of 1:1.3:2:4. That is, the channel width Woc2 of the offset compensation transistor MN6 in connecting region TA is Woc, the channel width Woc2 of the offset compensation transistor MN6 in connecting region TB is (1.3×Woc), the channel width Woc2 of the offset compensation transistor MN6 in connecting region TC is (2×Woc), and the channel width Woc2 of the offset compensation transistor MN6 in connecting region TD is (4×Woc), in consideration of the difference in complementary connecting wiring lengths (e.g., A2, B2, C2, and D2 of FIG. 5). Because of the difference in the channel widths Woc2, the turn-on resistance values Roc2 of the offset compensation transistors MN6 in the connecting regions TA, TB, TC and TD of the BLSAs are respectively 40 kohm, 30 kohm, 20 kohm, and 10 kohm.

That is, the length of the complementary connecting wirings according to the BLSA positions have a ratio of 1:2:3:4, whereas the turn-on resistance values Roc2 have a ratio of 4:3:2:1 so that a RC load, which is the sum of the parasitic loads (Rbp, Cbp) of the complementary connecting wiring and the compensation load Roc due to the offset compensation transistor, is made uniform. In other words, the offset compensation transistor MN6 has a turn-on resistance value Roc2 according to the reverse ratio of the connecting wiring length ratio.

The offset compensation transistor MN6 may be designed as in FIG. 8B according to the channel width ratio of FIG. 8A. Referring to FIG. 8B, in the offset compensation transistor MN6, a gate poly (indicated as gp in FIG. 8B) extending along the Y-direction while partially overlapping the active regions is placed on a pair of active regions which extend in the Y-direction and which are spaced apart from each other in the X-direction, and small square direct contacts (indicated as dc in FIG. 8B) are placed on each side of the gate poly on different X-axes. The direct contacts may be source/drain contacts that are each electrically connected to the active region. A channel width (indicated as a in FIG. 8B) may be defined as a longer length (a length in the Y-direction as shown) on the basis of the direct contacts in the gate poly layer, and an area formed as the channel due to the active region pair below the gate poly layer.

For example, the channel width Woc2 of the offset compensation transistor MN6 of the BLSA in the connecting region TA may be set as 1*a*, the channel width Woc2 of the offset compensation transistor MN6 of the BLSA in the connecting region TB may be set as 1.3*a*, the channel width Woc2 of the offset compensation transistor MN6 of the BLSA in the connecting region TC may be set as 2*a*, and the channel width Woc2 of the offset compensation transistor MN6 of the BLSA in the connecting region TD may be set as 4*a*.

FIG. 9A illustrates a table explanatory of a channel length of the offset compensation transistor included in the bit line sense amplifier according to some embodiments, and FIG. 9B is a layout diagram that simply shows the channel of the offset compensation transistor MN6 of FIGS. 6 and 9A.

For example, referring to FIGS. 5 and 9A, for the connecting regions TA, TB, TC and TD, the channel lengths Loc1 of the offset compensation transistors MN5 of the BLSAs have a ratio of 1:1:1:1. That is, the channel length Loc1 for the offset compensation transistors MN5 in each of connecting regions TA, TB, TC and TD is (4×Loc), and the turn-on resistance value Roc1 of the offset compensation transistors MN5 in each of the connecting regions TA, TB, TC and TD is 40 kohm. That is, in this example embodiment, the offset compensation transistors MN5 of the BLSAs in each connecting region have the same channel length and have the same turn-on resistance regardless of the BLSA position. On the other hand, as shown in FIG. 9A, in the connecting regions TA, TB, TC and TD, the turn-on resistance values Roc2 of the offset compensation transistors MN6 of the BLSAs are respectively 40 kohm, 30 kohm, 20 kohm, and 10 kohm, as a compensation load. For example, the channel lengths Loc2 of the offset transistors MN6 have a ratio of 4:3:2:1. That is, the channel length Loc2 of the offset compensation transistor MN6 in the connecting region TA is (4×Loc), the channel length Loc2 of the offset compensation transistor MN6 in the connecting region TB is (3×Loc), the channel length Loc2 of the offset compensation transistor MN6 in the connecting region TC is (2×Loc), and the channel length Loc2 of the offset compensation transistor MN6 in the connecting region TD is (Loc), in consideration of a difference in complementary connecting wiring lengths (e.g., A2, B2, C2, and D2 of FIG. 5). Since the resistance value R is proportional to the wiring length L according to the difference in the channel length Loc2, the ratio of the channel lengths Loc2 may be set to correspond to the reverse number and reverse ratio (Loc$_A$:Loc$_B$:Loc$_C$: Loc$_D$=1/1:1/2:1/3:1/4=4:3:2:1) of the ratio of the turn-on resistance value, that is, the ratio (A2:B2:C2:D2=1:2:3:4) of the connecting wiring lengths.

The offset compensation transistor MN6 may be designed as in FIG. 9B according to the channel length ratio of FIG. 9A. Referring to FIG. 9B, the offset compensation transistor MN6 of the BLSA in the connecting region TA for example has a gate poly (gp) extending along the Y-direction, two rectangular active regions each having a long axis in the Y-direction on one side (e.g., the left side) of the gate poly and spaced apart from each other in the Y-direction, and three active regions placed on the other side (e.g., the right side) of the gate poly and spaced apart from each other in the Y-direction. In top plan view, the active regions are configured for example in a left-right flipped number three shape. The direct contacts (dc) are respectively placed on active regions among the three active regions that are formed to be spaced apart from each other in the Y-direction on the other side (e.g., the right side) of the gate poly, that is the active regions on the right side of the gate poly other than the central active region. The direct contacts dc may be source/drain contacts that are each electrically connected to the corresponding active regions. The channel length (b) may be defined as a long length in the X-direction of the area of the channel formed by the gate poly layer directly overlapping (i.e., directly contacting) the layer below the gate poly layer. That is, the channel length (b) may be a channel length in the X-direction between the gate poly directly overlapping the active region thereunder, or in other words a channel length between the active region and the active regions spaced apart from each other in the X-direction around the gate poly.

For example, for the offset compensation transistor MN6 of the BLSA in the connecting region TA, as shown in FIG. 9B, since there are four channel lengths extending in the X-direction and traversing the active regions directly overlapped by and under the gate poly, or in other words four channels formed between the active regions and the active regions spaced apart from each other in the X-direction around the gate poly, the channel length Loc2 of the offset compensation transistor MN6 in the connecting region TA may be set as 4*b*. Since there are three channel lengths extending in the X-direction and traversing the active regions directly overlapped by and under the gate poly, or in other words three channels formed between the active regions in the X-direction, the channel length Loc2 of the offset compensation transistor MN6 of the BLSA in the connecting region TB may be set as 3*b*. For somewhat similar reasons, the channel length Loc2 of the offset compensation transistor MN6 in the connecting region TC may be set as 2*b*, and the channel length Loc2 of the offset compensation transistor MN6 in the connecting region TD may be set as 1*b*.

FIG. 10A illustrates a table explanatory of a channel length and a channel width of the offset compensation transistor included in the bit line sense amplifier according to some embodiments, and FIG. 10B is a layout diagram that simply shows the channel of the offset compensation transistor MN6 of FIGS. 6 and 10B.

For example, referring to FIGS. 5 and 10A, for the connecting region TA, TB, TC and TD, a ratio (Loc1/Woc1) of the channel lengths to the channel widths of the offset compensation transistors MN5 are the same regardless of the BLSA position, and each has the same turn-on resistance value. For example, the ratios Loc1/Woc1 of the offset compensation transistors MN5 have a ratio of 1:1:1:1. That is, the offset compensation transistors MN5 of the BLSAs in the connecting regions TA, TB, TC and TD have a same ratio Loc1/Roc1 and a turn-on resistance value Roc1 of 40 kohm.

On the other hand, in the connecting regions TA, TB, TC and TD, the offset compensation transistors MN6 of the BLSAs respectively have turn-on resistance value Roc2 of 40 kohm, 30 kohm, 20 kohm and 10 kohm, as a regulated compensation load. For example, in consideration of a difference in complementary connecting wiring lengths (e.g., A2, B2, C2, and D2 of FIG. 5), the offset compensation transistor MN6 of the BLSA in connecting region TA has a ratio Loc2/Roc2 that is (2×Loc/Woc), the offset compensation transistor MN6 of the BLSA in connecting region TB has a ratio Loc2/Roc2 that is ((Loc/0.8)×Woc), the offset compensation transistor MN6 of the BLSA in connecting region TC has a ratio Loc2/Roc2 that is (Loc/Woc), and the offset compensation transistor MN6 of the BLSA in connecting region TD has a ratio Loc2/Roc2 that is ((Loc/2)× Woc). The turn-on resistance values Roc2 of the offset compensation transistors MN6 have a ratio of 4:3:2:1. As explained above, since the resistance value R is proportional to the channel length L and inversely proportional to the channel width W, the ratios (Loc/Woc) of the channel lengths to the channel widths of the offset compensation transistors MN6 may be set to correspond to the reverse ratio (Loc_A:Loc_B:Loc_C:Loc_D=$\frac{1}{1}$:$\frac{1}{2}$:$\frac{1}{3}$:$\frac{1}{4}$=4:3:2:1) of the connecting wiring length, by adjusting the channel width or the channel length depending on the ratio of the turn-on resistance value.

The offset compensation transistor MN6 may be designed as in FIG. 10B according to the channel length/channel width ratio of FIG. 10A. Referring to FIG. 10B, the offset compensation transistor MN6 of the BLSA in connecting region TA has a gate poly layer extending in the Y-direction. One active region having a long axis in the Y-direction is placed on one side (e.g., the left side) of the gate poly gp, two active regions having a long axis in the Y-direction and spaced apart from each other in the Y-direction are placed on the other side (e.g., the right side) of the gate poly, and a direct contact is placed in each of the two active regions on the right side of the gate poly. The channel width Woc of the offset compensation transistor MN6 in the connecting region TA as extending along the Y-direction is $1a$, and the channel length Loc is $2b$. Respective active regions of the offset compensation transistor MN6 in the connecting region TB are placed on both sides of the gate poly and have different Y-axis length, and respective direct contacts dc are placed in the active regions. The channel width Woc is 0.8a because the channel formed under the gate poly layer is formed on the basis of the short active region on the right side of the gate poly, and the channel length Loc traversing the active region directly overlapped by the gate poly and extending in the X-direction is $1b$. In the connecting region TC, active regions having the same Y-axis length are each placed on both sides of the gate poly, and direct contacts are respectively placed in each of the active regions. In the channel formed under the gate poly layer, the channel width Woc is $1a$ and the channel length Loc is $1b$. In the connecting region TD, two gate polys (e.g., first and second gate polys) are spaced apart in the X-direction while extending in the Y-direction, and three active regions are included as each extending in the Y-direction. A first active region is placed on the left side of the first gate poly, a second active region is placed between the first and second gate polys, and a third active region is placed on the right side of the second gate poly. Direct contacts are placed alternately with respect to each other, one for each of the active regions. The channel formed under the gate polys has a channel width Woc of $2a$ and a channel length Loc of $1b$.

In the case of the embodiments of FIGS. 10A and 10B, there is an advantage that the area of the offset compensation transistor MN6 can be designed to be optimized for the layout of the memory device, as compared to a case of adjusting only the channel width (FIGS. 8A and 8B) or a case of adjusting only the channel length (FIGS. 9A and 9B) as described above.

FIGS. 11A and 11B illustrate circuit diagrams of bit line sense amplifiers according to some embodiments. The bit line sense amplifier 10 of FIGS. 11A and 11B may be another embodiment of the bit line sense amplifier 150 of FIG. 1.

BLSAs 21 and 22 of FIGS. 11A and 11B include similar components as the BLSA shown in FIG. 6, but however further include switch transistors SW1 and SW2 not included in the BLSA 10 of FIG. 6. For convenience of explanation, the following description will focus on differences between BLSAs 21 and 22 in FIGS. 11A and 11B and the BLSA 10 in FIG. 6, and repeated explanations of similar components in FIGS. 11A and 11B may be omitted for brevity.

According to some embodiments, the switch transistors SW1 and SW2 may be connected in series with the offset compensation transistors MN5 and MN6. Specifically, in the memory device, the switch transistors SW1 and SW2 may be connected in series to each of the offset compensation transistor MN5 and the offset compensation transistor MN6 such as shown in FIG. 11A, depending on the length of the connecting wiring, or the switch transistor SW1 may be connected in series to any one of offset compensation transistor MN5 or MN6 such as shown in FIG. 11B.

According to an embodiment, the connecting regions TA, TB, and TC (e.g., see FIG. 5) each include BLSAs 21 including the switch transistors SW1 and SW2 respectively in connection with the offset compensation transistors MN5 and MN6 at both ends of the BLSA 21, such as shown in FIG. 11A. On the other hand, the connecting region TD having the longest connecting wiring may include BLSA 22 including the switch transistor SW1 in connection with only one offset compensation transistor MN5 as shown in FIG. 11B.

Specifically, the BLSAs 21 of the connecting regions TA, TB, and TC may include an offset compensation transistor MN5 and a switch transistor SW1 connected in series between the complementary sensing bit line node N3 and the bit line node N5, and may include an offset compensation transistor MN6 and a switch transistor SW2 connected in series between the sensing bit line node N4 and the complementary bit line node N6. The BLSA 22 of the connecting region TD may include an offset compensation transistor MN5 and a switch transistor SW1 connected in series between the complementary sensing bit line node N3 and the bit line node N5, and may include an offset compensation transistor MN6 connected in series between the sensing bit line node N4 and the complementary bit line node N6.

FIGS. 12 and 13 illustrate tables explanatory of a channel width of a switch transistor included in the bit line sense amplifier according to some embodiments.

In the complementary bit line BLB of the BLSA 22 of the connecting region TD, a RC load is based on a total resistance of the turn-on resistance of the offset compensation transistor MN6 and the parasitic resistances Rbp and Rb1 according to the connecting wiring length, as shown in FIG. 11B. In the bit line BL of the BLSA 22 of the connecting region TD, the RC load is based on a total resistance of the turn-on resistance of the offset compensation transistor MN5, the turn-on resistance of the switch transistor SW1, and the parasitic resistance Rb1 according to the connecting wirings, as also shown in FIG. 11B. Since the offset compensation transistor MN5 and the offset compensation transistor MN6 have the same turn-on resistance, the switch transistor SW1 is adjusted to have a turn-on resistance value corresponding to the parasitic resistance Rbp due to a difference in connecting wiring length between the bit line side and the complementary bit line side, as the compensation load. For example, as shown in FIG. 12, for the switch transistor SW1 included in the BLSA 22 of the connecting region TD, the channel width Wsw1 may be set to a preset width Wsw to have the turn-on resistance value RSW1 of 30 kohm.

As shown in FIG. 11A, the switch transistors SW1 included in the BLSAs 21 of the connecting regions TA, TB, and TC are adjusted to have a turn-on resistance value of 30 kohm corresponding to the parasitic resistance Rbp due to the difference in connecting wiring length between the bit line side and the complementary bit line side. For example, as shown in FIG. 13, the channel width Wsw1 of the switch transistors SW1 in the connecting regions TA, TB and TC may be set as Wsw, as in the connecting region TD.

However, as may be understood in view of FIG. 5 for example, the switch transistors SW2 included in the BLSAs 21 of the connecting regions TA, TB, and TC have different lengths of connecting wirings. Therefore, the channel widths of the switch transistors SW2 of the memory device 100 may be set to have turn-on resistance values corresponding to the reverse ratio of the connecting wiring lengths. That is, the channel widths of the switch transistors between the BLSAs of different positions may be adjusted to correspond to the ratio of the connecting wiring length.

For example, as shown in FIG. 13, as the switch transistor SW2 of the connecting region TA is designed to have a channel width Wsw2 of Wsw, the switch transistor SW2 of the connecting region TB is designed to have a channel width Wsw2 of (1.5×Wsw), and the switch transistor SW2 of the connecting region TC is designed to have a channel width Wsw2 of (3×Wsw) (that is, the ratio of the channel width is 1:2:3), the turn-on resistance values Rsw2 (30 kohm, 20 kohm, and 10 kohm) of the respective switch transistors may have a reverse ratio (3:2:1) corresponding to the lengths of the connecting wirings of the connecting region TA, the connecting region TB, and the connecting region TC.

Although a layout of channel width adjustment is not shown or described with respect to FIGS. 11A and 11B, channel width may be set depending on the overlap length of the gate electrode and the source/drain contact, as described with respect to FIG. 8B.

FIG. 14 illustrates a table explanatory of a channel length of the switch transistor included in the bit line sense amplifier according to some embodiments.

Referring to FIG. 14, the switch transistor SW1 included in the BLSAs 21 (see FIG. 11A) of the connecting regions TA, TB, and TC are adjusted to have turn-on resistance values Rsw1 corresponding to the parasitic resistance Rbp due to a difference in connecting wiring length between the bit line side and the complementary bit line side, i.e., 30 kohm, as shown in FIG. 14.

As shown in FIG. 14, since the switch transistors SW2 included in the BLSAs 21 of the connecting regions TA, TB, and TC have different lengths of the connecting wiring, the channel lengths of the switch transistors SW2 of the memory device 100 may be differently set to have turn-on resistance values corresponding to the reverse ratio of the connecting wiring length. Since the turn-on resistance values are proportional to the channel length, the channel length of the switch transistors of the BLSAs at different positions may be adjusted to correspond to the reverse ratio of the connecting wiring length.

For example, as shown in FIG. 14, the switch transistor SW2 of the BLSA of the connecting region TA has a channel length Lsw2 of (3×Lsw), the switch transistor SW2 of the BLSA of the connecting region TB has a channel length Lsw2 of (2×Lsw), and the switch transistor SW2 of the BLSA of the connecting region TC has a channel length Lsw2 of Lsw. That is, the channel length is set to a ratio of 3:2:1, which is the reciprocal of the length ratio 1:2:3 of the connecting wirings of the connecting region TA, the connecting region TB, and the connecting region TC. Accordingly, the turn-on resistance ratio of the switch transistor SW2 of the connecting region TA, the switch transistor SW2 of the connecting region TB, and the switch transistor SW2 of the connecting region TC may be 3:2:1 (e.g., 30 kohm, 20 kohm, and 10 kohm respectively).

Although the layout of channel length adjustment is not shown, it may be set depending on the intersecting distances of the gate electrodes and the source/drain contacts between the vias, as described with respect to FIG. 9B.

Figures 15, 16, 17:
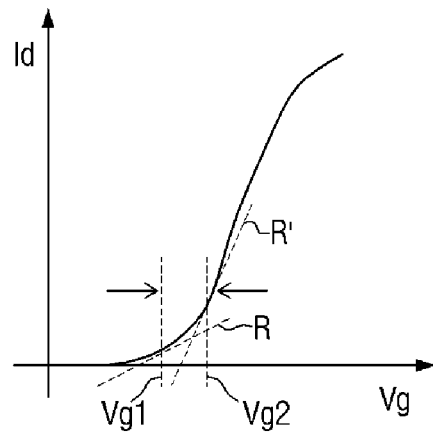
FIG. 15 illustrates a table explanatory of a ratio of the channel length to the channel width of the switch transistor included in the bit line sense amplifier according to embodiments of the inventive concepts.
FIG. 16 illustrates a voltage-current graph explanatory of a turn-on resistance change of a transistor according to the gate bias.
FIG. 17 illustrates a table explanatory of the gate bias setting of a switch transistor included in a bit line sense amplifier according to embodiments of the inventive concepts.
Figure 18:
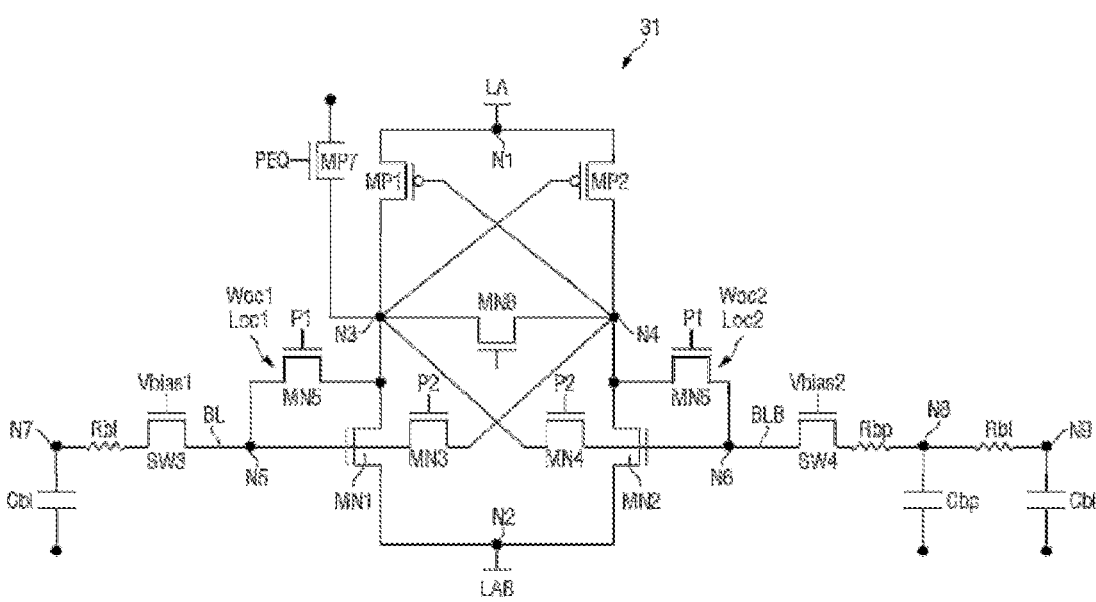
FIGS. 18A and 18B illustrate circuit diagrams of bit line sense amplifiers according to embodiments of the inventive concepts.
Figure 18:
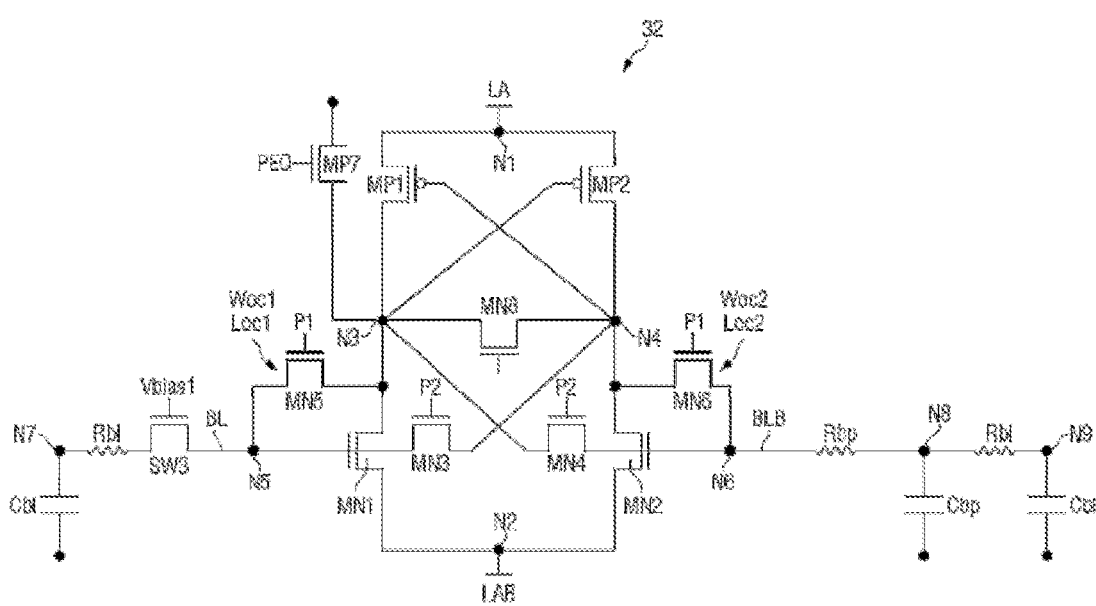
Figure 24:
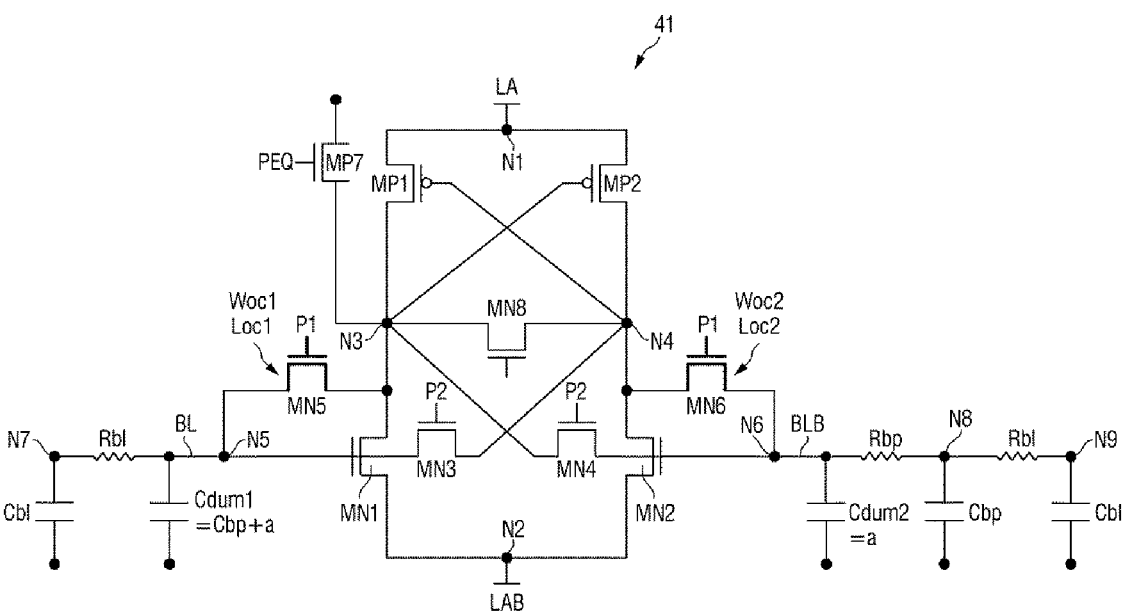
FIGS. 24A and 24B illustrate circuit diagrams of bit line sense amplifiers according to embodiments of the inventive concepts.
Figure 24:
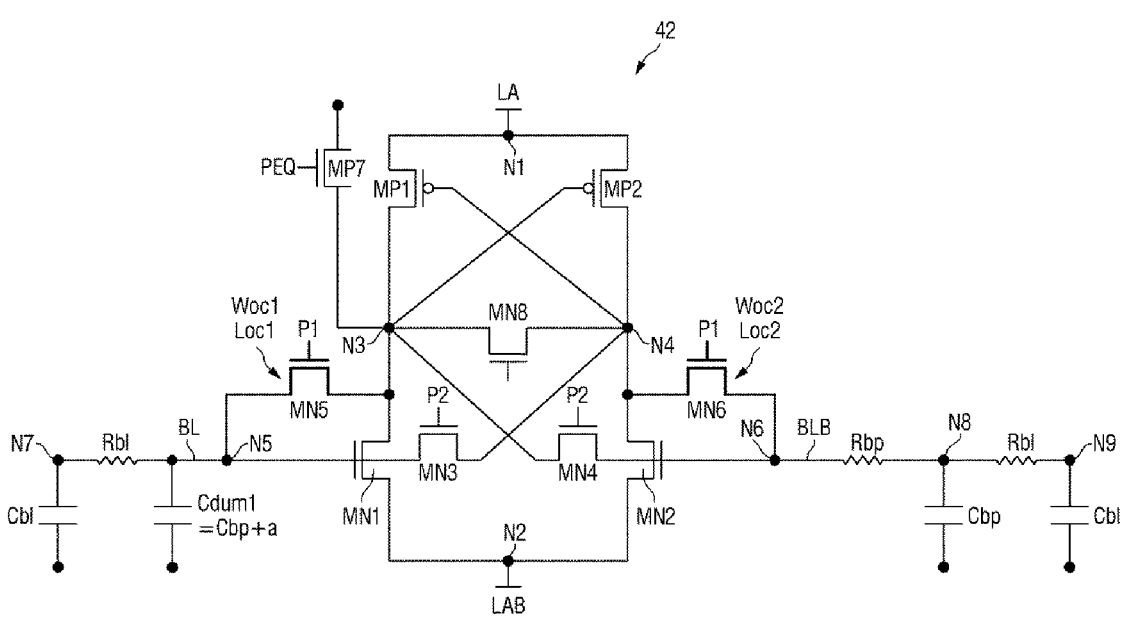
Figure 25:
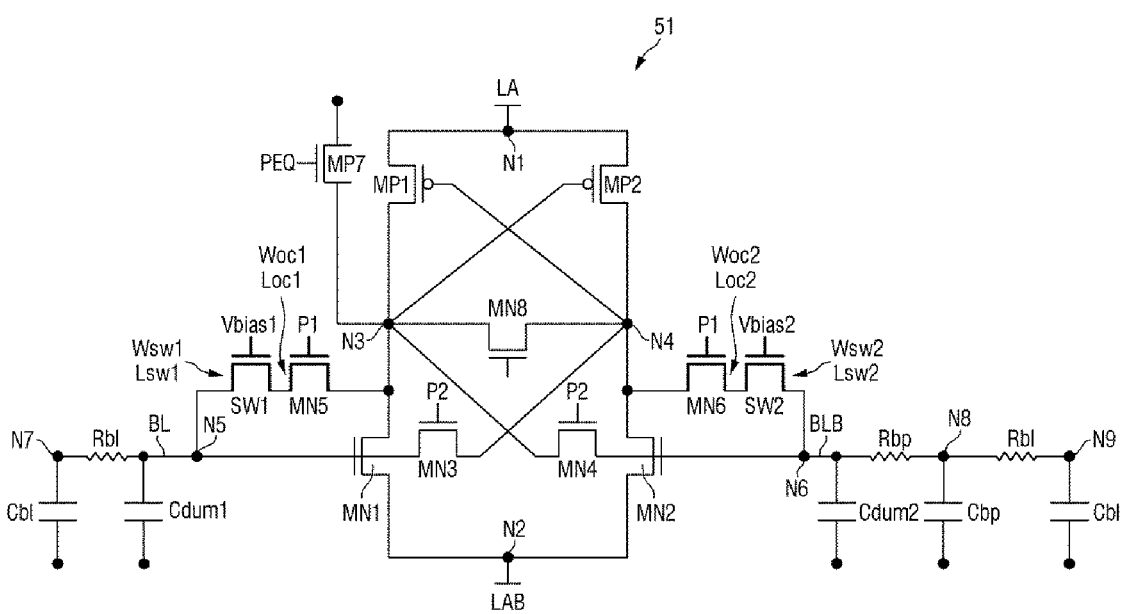
FIGS. 25A and 25B illustrate circuit diagrams of bit line sense amplifiers according to embodiments of the inventive concepts.
Figure 25:
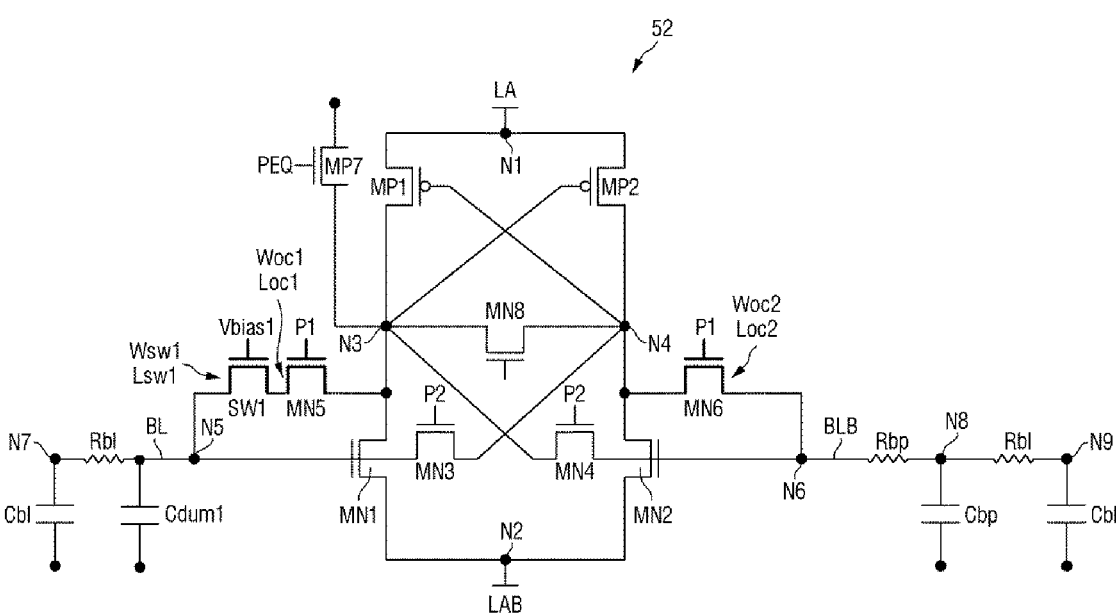
Figure 26:
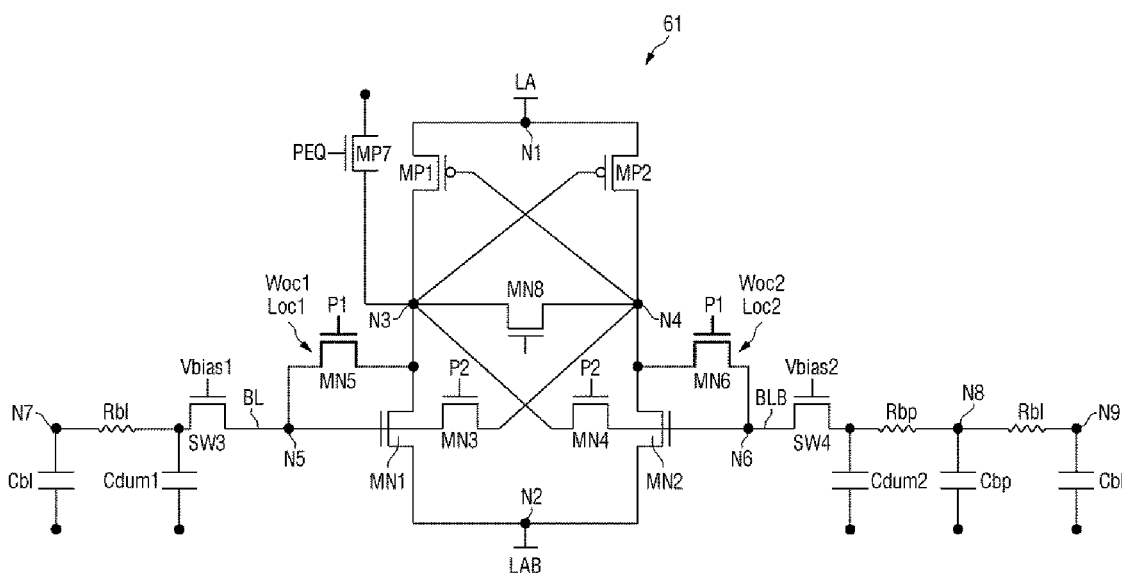
FIGS. 26A and 26B illustrate circuit diagrams of bit line sense amplifiers according to embodiments of the inventive concepts.
Figure 26:
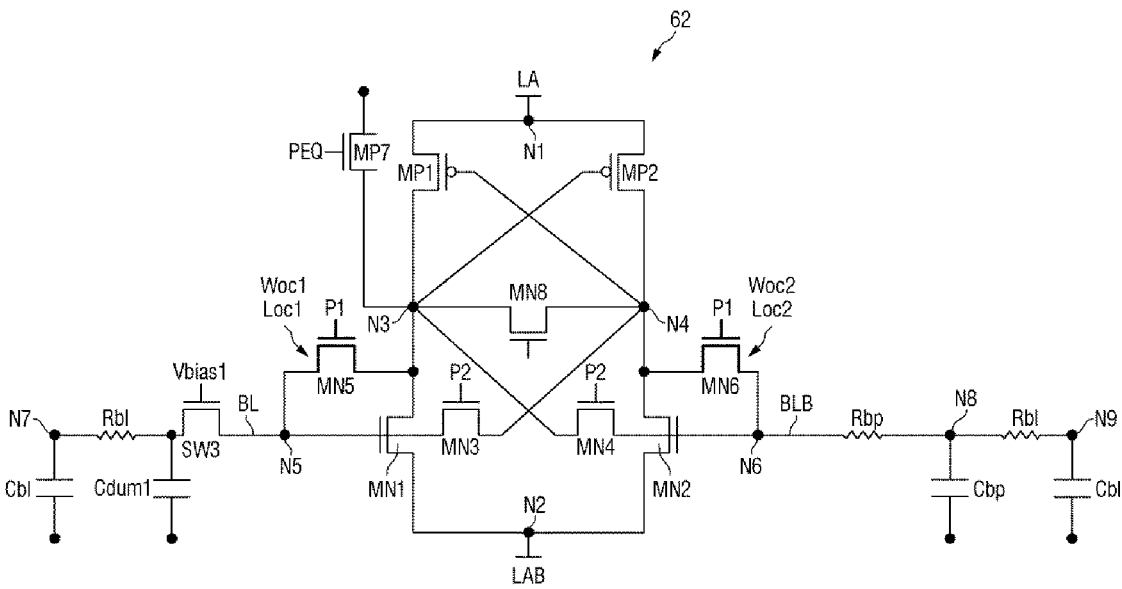

FIG. 15 illustrates a table explanatory of a ratio of the channel length to the channel width of the switch transistor included in the bit line sense amplifier according to some embodiments.

Referring to FIG. 15, the switch transistors SW1 included in the BLSAs 21 (see FIG. 11A) of the connecting regions TA, TB, and TC are adjusted to have turn-on resistance values Rsw1 corresponding to the parasitic resistance Rbp due to a difference in connecting wiring length between the bit line side and the complementary bit line side, (i.e., 30 kohm).

As described with respect to FIGS. 13 and 14, ratios (Lsw2/Wsw2) of the channel length to the channel width of the switch transistors SW2 of the memory device 100 may be set differently to have turn-on resistance values corresponding to the reverse ratio of the connecting wiring lengths of the connecting regions TA, TB, and TC. Since the turn-on resistance value is inversely proportional to the channel width and proportional to the channel length, the ratios (Lsw/Wsw) of the channel length to the channel width of the switch transistors of the BLSAs at different positions of the memory device 100 may be adjusted to correspond to the reverse ratio of the connecting wiring length.

For example, as shown in FIG. 15, the switch transistor SW2 of the BLSA of the connecting region TA has a channel length Lsw2 of (1.5×Lsw) and a channel width Wsw2 of (0.5×Wsw), the switch transistor SW2 of the BLSA of the connecting region TB has a channel length Lsw2 of (1.5× Lsw) and a channel width Wsw2 of (0.75×Wsw), and the switch transistor SW2 of the connecting region TC has a channel length Lsw2 of Lsw and a channel width Wsw2 of Wsw. As a result, the turn-on resistance ratio of the connecting region TA switch transistor SW2, the connecting region TB switch transistor SW2, and the connecting region TC switch transistor SW2 may be set to 3:2:1

$$\left( = \frac{1.5}{0.5}; \frac{1.5}{0.75}; \frac{1}{1} \right),$$

or in other words for example 30 kohm, 20 kohm, and 10 kohm respectively.

Although the layout of ratio adjustment of the channel length to the channel width is not shown, it may be set depending on the overlap length of the gate electrodes and the source/drain contacts and the intersecting distances of the gate electrodes and the source/drain contacts between the vias, as described with respect to FIG. 10B.

FIG. 16 illustrates a voltage-current graph explanatory of a turn-on resistance change of a transistor according to the gate bias, and FIG. 17 illustrates a table explanatory of the gate bias setting of a switch transistor included in a bit line sense amplifier according to some embodiments. The horizontal X-axis represents gate bias voltage (Vg) of a transistor, and the vertical Y-axis represents drain current (Id) of the transistor.

Referring to FIG. 16, the turn-on resistance of the transistor may adjusted by adjusting the gate bias. In the signal curve of the voltage-current graph, when the gate bias is Vg1, the resistance value is R. However, when the gate bias becomes Vg2, the resistance value changes to R' depending on the slope of the curve. Compared to FIG. 7, in which the turn-on resistance value is adjusted by adjusting the channel width and the channel length of the transistor, the turn-on resistance value may be adjusted more finely by adjusting only the gate bias without changing the design of the transistor element.

Referring to FIG. 17, the turn-on resistance values of the switch transistors SW2 of the BLSAs of the connecting regions TA, TB, and TC may be adjusted by adjusting the gate bias. Since the resistance is proportional to the voltage (R∝V_g), in the memory device 100 the gate bias may be applied to the switch transistors SW2 of the connecting regions at the reverse ratio of the length of the connecting wiring.

As shown in the example of FIG. 17, the gate bias may also be applied by being adjusted to a 3:2:1 ratio, so that the turn-on resistance ratio of the connecting region TA switch transistor SW2, the connecting region TB switch transistor SW2, and the connecting region TC switch transistor SW2 becomes 3:2:1. That is, when the gate bias Vbias2 of the connecting region TA switch transistor SW2 is set to Vbias, the gate bias Vbias2 of the connecting region TB switch transistor SW2 is set to (0.7×Vbias), and the gate bias Vbias2 of the connecting region TC switch transistor SW2 is set to (0.5V×Vbias), the respective turn-on resistances Rssw2 may be 30 kohm, 20 kohm and 10 kohm.

FIGS. 18A and 18B illustrate circuit diagrams of bit line sense amplifiers according to some embodiments. The bit line sense amplifiers 31 and 21 of FIGS. 18A and 18B may be still another embodiment of bit line sense amplifier 150 of FIG. 1.

BLSAs 31 and 32 of FIGS. 18A and 18B include similar components as the BLSA shown in FIG. 6, but however further include compensation transistors SW3 and SW4, which are not included in the BLSA 10 of FIG. 6. For convenience of explanation, the following description will focus on differences between BLSAs 31 and 32 in FIGS. 18A and 11B and the BLSA 10 in FIG. 6, and repeated explanations of similar components in FIGS. 18A and 18B may be omitted for brevity.

According to some embodiments, the compensation transistor SW3 may be connected in series to the bit line node N5, and the compensation transistor SW4 may be connected in series to the complementary bit line node N6. Specifically, depending on the length of the connecting wiring, the compensation transistors SW3 and SW4 may be connected in series respectively to the bit line node N5 and the complementary bit line node N6 as shown in FIG. 18A, or only the compensation transistor SW3 may be connected in series to the bit line node N5 as shown in FIG. 18B.

According to an embodiment, the BLSAs 31 of the connecting regions TA, TB, and TC include compensation transistors SW3 and SW4 respectively connected in series at bit line node N5 and the complementary bit line node N6 as in FIG. 18A, and the BLSA 32 of the connecting region TD having the longest connecting wiring length may include only the compensation transistor SW3 connected in series at the bit line node N5 as in FIG. 18B.

FIGS. 19 and 20 illustrate tables explanatory of a channel width of a compensation transistor included in the bit line sense amplifier according to some embodiments.

The RC load on the complementary bit line of the connecting region TD BLSA 32 is based on the total resistance of the turn-on resistance value of the offset compensation transistor MN6 and the parasitic resistances Rbp and Rb1 due to the connecting wiring length. The RC load on the bit line of the connecting region TD BLSA 32 is based on the total resistance of the turn-on resistance value of the offset compensation transistor MN5, the turn-on resistance value of the compensation transistor SW3, and the parasitic resistance Rb1 due to the connecting wiring. Since the offset compensation transistor MN5 and the offset compensation transistor MN6 have the same turn-on resistance, the compensation transistor SW3 is adjusted to have the turn-on resistance value corresponding to the parasitic resistance Rbp due to the difference in the connecting wiring length between the bit line side and the complementary bit line side, as a compensation load. For example, the channel width Wsw1 of the compensation transistor SW3 included in the BLSA 32 of the connecting region TD may be set to a preset width Wsw to have the turn-on resistance value Rsw1 of 30 kohm, as shown in FIG. 19.

As shown in FIG. 20, the compensation transistor SW3 included in the BLSAs 31 of the connecting regions TA, TB, and TC are adjusted to have turn-on resistance values Rsw1 corresponding to the parasitic resistance Rbp due to the difference in connecting wiring length between the bit line side and the complementary bit line side, that is, 30 kohm. For example, as shown in FIG. 20, the channel width Wsw1 of the compensation transistors SW3 may be set to Wsw, similarly to the connecting region TD.

However, the compensation transistors SW4 included in the BLSAs 31 of the connecting regions TA, TB, and TC have different lengths of the connecting wiring (see FIG. 5). Therefore, the parasitic resistances Rbp vary. The channel widths of the compensation transistors SW4 in the connecting regions TA, TB, and TC may be set differently to have turn-on resistance values corresponding to the reverse ratio of the connecting wiring length. That is, the channel widths of the compensation transistors SW4 of the BLSAs at different positions may be adjusted to correspond to the ratio of the connecting wiring length.

For example, as shown in FIG. 20, when the compensation transistor SW4 of the BLSA of the connecting region TA is designed to have a channel width Wsw2 of Wsw, the compensation transistor SW4 of the BLSA of the connecting region TB is designed to have a channel width Wsw2 of (1.5×Wsw), and the compensation transistor SW4 of the BLSA of the connecting region C is designed to have a channel width Wsw2 of (3×Wsw) (i.e., the channel width has a ratio of 1:2:3), the turn-on resistance values Rsw2 (e.g., 30 kohm, 20 kohm, and 10 kohm respectively) of the compensation transistors may have the reverse ratio (3:2:1) corresponding to the length of the connecting wiring of the connecting region A, the connecting region B and the connecting region C.

Although a layout of the channel width adjustment is not shown, it may be set depending on the overlap lengths of the gate electrodes and the source/drain contacts, as described with respect to FIG. 8B.

FIG. 21 illustrates a table explanatory of a channel length of the compensation transistor included in the bit line sense amplifier according to some embodiments.

Referring to FIG. 21, the compensation transistors SW3 included in the BLSAs 31 of the connecting regions TA, TB, and TC are adjusted to have turn-on resistance values Rsw1 corresponding to a parasitic resistance Rbp due to the difference in connecting wiring length between the bit line side and the complementary bit line side, i.e., 30 kohm, as shown in FIG. 18A.

For the compensation transistors SW4 included in the BLSAs 31 of the connecting regions TA, TB, and TC, the channel lengths of the compensation transistors SW4 of the memory device 100 may be differently set corresponding to the reverse ratio of the connecting wiring length, as shown in FIG. 18A. Since the turn-on resistance value is proportional to the channel length, the channel length of the switch transistors of the BLSAs at different positions may be adjusted to correspond to the reverse ratio of the connecting wiring length.

For example, as shown in FIG. 21, the compensation transistor SW4 of the connecting region TA may be set to a channel length Lsw2 of (3×Lsw), the compensation transistor SW4 of the connecting region TB may be set to a channel length Lsw2 of (2×Lsw), and the compensation transistor SW4 of the connecting region TC may be set to a channel length Lsw2 of Lsw. That is, the channel lengths Lsw2 of the compensation transistors SW4 are set to a ratio of 3:2:1, which is the reciprocal of the length ratio of the connecting region TA, the connecting region TB, and the connecting region TC connecting wirings that is 1:2:3. Accordingly, the turn-on resistance ratios of the connecting region TA compensation transistor SW4, the connecting region TB compensation transistor SW4, and the connecting region TC compensation transistor SW4 may become 3:2:1 (e.g., 30 kohm, 20 kohm, and 10 kohm respectively).

Although the layout of the channel length adjustment is not shown, it may be set depending on the intersecting distances of the gate electrodes and the source/drain contacts between the vias, as described with respect to FIG. 9B.

FIG. 22 illustrates a table explanatory of a ratio of the channel length to the channel width of the switch transistor included in the bit line sense amplifier according to some embodiments.

Referring to FIG. 22, the compensation transistors SW3 included in the BLSAs 31 of the connecting regions TA, TB, and TC are adjusted to have a turn-on resistance value corresponding to a parasitic resistance Rbp due to the difference in connecting wiring length between the bit line side and the complementary bit line side, i.e., 30 kohm, as shown in FIG. 18A.

In the memory device 100, ratios (Lsw2/Wsw2) of the channel length to the channel width of the compensation transistors SW4 may be set differently to have a turn-on resistance value ratio of the compensation transistors SW4 corresponding to the reverse ratio of the connecting wiring lengths of the connecting regions TA, TB, and TC. Since the turn-on resistance value is inversely proportional to the channel width and proportional to the channel length, the ratios (Lsw2/Wsw2) of the channel length to the channel width of the switch transistors of the BLSAs of the memory device 100 at different positions may be adjusted to correspond to the reverse ratio of the connecting wiring length.

For example, as shown in FIG. 22, the compensation transistor SW4 of the BLSA of the connecting region TA has a channel length Lsw2 of (1.5×Lsw) and a channel width Wsw2 of (0.5×Wsw), the compensation transistor SW4 of the BLSA of the connecting region TB has a channel length Lsw2 of (1.5×Lsw) and a channel width Wsw2 of (0.75× Wsw), and the compensation transistor SW4 of the BLSA of the connecting region TC has a channel length Lsw2 of Lsw, and a channel width Wsw2 of Wsw. As a result, the turn-on resistance ratio of the connecting region TA compensation transistor SW4, the connecting region TB compensation transistor SW4 and the connecting region TC compensation transistor SW4 may be set to 3:2:1

$$( = \frac{1.5}{0.5} : \frac{1.5}{0.75} : \frac{1}{1}),$$

or for example 30 kohm, 20 kohm, and 10 kohm respectively.

Although layout of the ratio adjustment of the channel length to the channel width is not shown, it may be set depending on the overlap length of the gate electrodes and the source/drain contacts and the intersecting distance of the gate electrode sand the source/drain contacts between the vias, as described with respect to FIG. 10B.

FIG. 23 illustrates a table explanatory of gate bias settings of a switch transistor included in the bit line sense amplifier according to some embodiments.

Referring to FIG. 23, for the compensation transistors SW3 of the connecting regions TA, TB, and TC, the gate bias may be adjusted to adjust the turn-on resistance value. Since the resistance is proportional to the voltage ($R \propto V_g$), the gate bias of the memory device 100 may be applied to the gate transistors SW3 of each region at the reverse ratio of the length of the connecting wiring.

In the shown example, the gate bias Vbias2 may also be applied by being adjusted to a ratio of 3:2:1 so that the turn-on resistance ratio of the connecting region TA compensation transistor SW4, the connecting region TB compensation transistor SW4, and the connecting region TC compensation transistor SW4 becomes 3:2:1. That is, when the gate bias Vbias2 of the connecting region TA compensation transistor SW4 is applied to be set to Vbias, the gate bias Vbias2 of the connecting region TB compensation transistor SW4 is applied to be set to (0.7×Vbias), and the gate bias Vbias2 of the connecting region TC compensation transistor SW4 is applied to be set to (0.5×Vbias), the respective turn-on resistance values Rsw2 may be 30 kohm, 20 kohm, and 10 kohm.

FIGS. 24A and 24B illustrate circuit diagrams of bit line sense amplifiers according to some embodiments. The bit line sense amplifiers 41 and 42 of FIGS. 24A and 24B may be still another embodiment of the bit line sense amplifier 150 of FIG. 1.

As compared to the BLSA 10 in FIG. 6, the BLSAs 41 and 42 of FIGS. 24A and 24B further include dummy capacitors Cdum1 and Cdum2 which are not included in the BLSA 10 of FIG. 6. For convenience of explanation, the following description will focus on differences between BLSAs 41 and 42 in FIGS. 24A and 24B and the BLSA 10 in FIG. 6, and repeated explanations of similar components as described with respect to FIG. 6 may be omitted for brevity.

According to some embodiments, the BLSAs 41 are disposed in the connecting regions TA, TB, and TC (see FIG. 5) as including dummy capacitor Cdum1 connected to the bit line BL, and dummy capacitor Cdum2 connected to the complementary bit line BLB, as shown in FIG. 24A. BLSA 42 is disposed in the connecting region TD having the longest connecting wiring length, and may include dummy capacitor Cdum1 connected to bit line BL, as shown in FIG. 24B. The BLSAs 41 of the connecting regions TA, TB, and TC include a dummy capacitor Cdum1 connected in parallel to the bit line node N5, and a dummy capacitor Cdum2 connected in parallel to the complementary bit line node N6, as shown in FIG. 24A.

The dummy capacitor Cdum1 connected to the bit line node N5 may have a capacitance greater than the dummy capacitor Cdum2 connected to the complementary bit line node N6 by the parasitic capacitance Cbp of the complementary bit line node N6. For example, when the dummy capacitance Cdum2 is assumed to have a capacitance C, the dummy capacitance Cdum1 may be a capacitance reflecting the capacitance C and the parasitic capacitance Cbp.

As described previously, the memory device includes a plurality of BLSAs each having a compensation load adjusted corresponding to the connecting wiring length for each connecting region. For example, the compensation load of the BLSA 41 of the connecting region TA may be adjusted by varying the channel width, the channel length, the ratio of the channel length to the channel width of the offset compensation transistors MN5 and MN6 as described with respect to FIGS. 7 and 10B, and the capacitance of the dummy capacitors Cdum1 and Cdum2 may be adjusted to equalize a total RC load of each bit line/complementary bit line as described with respect to FIGS. 24A and 24B.

FIGS. 25A and 25B illustrate circuit diagrams of bit line sense amplifiers according to some embodiments. The bit line sense amplifiers 51 and 52 in FIGS. 25A and 25B may be still another embodiment of bit line sense amplifier 150 of FIG. 1.

As compared to the BLSA 10 in FIG. 6, BLSAs 51 and 52 of FIGS. 25A and 25B further include switch capacitors SW1 and SW2 and dummy capacitors Cdum1 and Cdum2, which are not included in the BLSA 10 of FIG. 6. For convenience of explanation, the following description will focus on differences between BLSAs 51 and 52 in FIGS. 25A and 25B and the BLSA 10 in FIG. 6, and repeated explanations of similar components as described with respect to FIG. 6 may be omitted for brevity.

According to some embodiments, the switch transistor SW1 may be connected in series to the offset compensation transistor MN5, and switch transistor SW2 may be connected in series to the offset compensation transistor MN6. According to an embodiment, the BLSA 51 as shown in FIG. 25A are disposed in the connecting regions TA, TB, and TC (see FIG. 5) and include switch transistors SW1 and SW2 respectively connected in series to the offset compensation transistors MN5 and MN6 at both ends of the BLSA 51, and further include dummy capacitor Cdum1 connected to the bit line BL and dummy capacitor Cdum2 connected to the complementary bit line BLB. The BLSA 52 as shown in FIG. 25B is disposed in connecting region TD having the longest connecting wiring length and may include only switch transistor SW1 and the offset compensation transistor MN5, and may further include a dummy capacitor Cdum1 connected to the bit line BL.

Specifically, the BLSAs 51 of the connecting regions TA, TB, and TC include an offset compensation transistor MN5 and a switch transistor SW1 connected in series between the complementary sensing bit line node N3 and the bit line node N5, and include a dummy capacitor Cdum1 connected in parallel to the bit line node N5. The BLSAs 51 further include an offset compensation transistor MN6 and a switch transistor SW2 connected in series between the sensing bit line node N4 and the complementary bit line node N6, and further include a dummy capacitor Cdum2 connected in parallel to the complementary bit line node N6.

The BLSA 52 of the connecting region D includes an offset compensation transistor MN5 and a switch transistor SW1 connected in series between the complementary sensing bit line node N3 and the bit line node N5, and may further include an offset compensation transistor MN6 connected between the sensing bit line node N4 and the complementary bit line node N6. The BLSA 52 may further include a dummy capacitor Cdum1 connected in parallel to the bit line node N5.

As described previously, the memory device includes a plurality of BLSAs each having a compensation load adjusted corresponding to the connecting wiring length for each region. For example, the compensation load of the BLSA 51 of the connecting region TA may be adjusted by varying the channel width, the channel length, the ratio of the channel length to the channel width, or the gate bias of the switch transistors SW1 and SW2 to adjust the turn-on resistance value, as described with respect to FIGS. 11A to 17, and the capacitances of the dummy capacitors Cdum1 and Cdum2 may be adjusted to equalize the total RC load of each bit line/complementary bit line as described with respect to FIGS. 24A and 24B.

FIGS. 26A and 26B illustrate circuit diagrams of bit line sense amplifiers according to some embodiments. The bit line sense amplifiers 61 and 62 of FIGS. 26A and 26B may be still another embodiment of bit line sense amplifier 150 of FIG. 1.

As compared to the BLSA 10 of FIG. 6, BLSAs 61 and 62 of FIGS. 26A and 26B further include compensation capacitors SW3 and SW4 and dummy capacitors Cdum1 and Cdum2, which are not included in the BLSA 10 of FIG. 6. For convenience of explanation, the following description will focus on differences between BLSAs 61 and 62 in FIGS. 26A and 26B and the BLSA 10 in FIG. 6, and repeated explanations of similar components as described with respect to FIG. 6 may be omitted for brevity.

According to some embodiments, the compensation transistor SW3 may be connected in series to the bit line BL and the compensation transistor SW4 may be connected in series to the complementary bit line BLB. According to an embodiment, the BLSA 61 as shown in FIG. 26A may be disposed in the connecting regions TA, TB, and TC (see FIG. 5) and may include compensation transistors SW3 and SW4 respectively connected in series to the bit line node N5 and the complementary bit line node N6 at both ends of the BLSA 61, and may further include dummy capacitor Cdum1 connected to the bit line node N5 and capacitor Cdum2 connected to the complementary bit line node N6. The BLSA 62 as shown in FIG. 26B may be disposed in the connecting region TD having the longest connecting wiring length and may include a compensation transistor SW3 connected only to the bit line BL (or only to the complementary bit line BL), and may further include a dummy capacitor Cdum1 connected to the bit line BL (or the complementary bit line BLB).

Specifically, as shown in FIG. 26A the BLSA 61 of the connecting regions TA, TB, and TC include a compensation transistor SW3 connected in series to the bit line node N5, and a dummy capacitor Cdum1 connected in parallel to the bit line node N5. The BLSA 61 further includes a compensation transistor SW4 connected in series to the complementary bit line node N6, and a dummy capacitor Cdum2 connected in parallel to the complementary bit line node N6.

The BLSA 22 of the connecting region TD includes a compensation transistor SW3 connected in series between the bit line node N5, and may further include a dummy capacitor Cdum1 connected in parallel to the bit line node N5, as shown in FIG. 26B.

As described above, the memory device includes a plurality of BLSAs each having a compensation load adjusted corresponding to the connecting wiring length for each connecting region. For example, the compensation load of the BLSA 61 of the connecting region A may be adjusted by varying the channel width, the channel length, the ratio of the channel length to the channel width, or the gate bias of the compensation transistors SW3 and SW4 to adjust the turn-on resistance value as described with respect to FIGS. 18A to 23, and the capacitances of the dummy capacitors Cdum1 and Cdum2 may be adjusted to equalize the total RC load of each bit line/complementary bit line as described with respect to FIGS. 24A and 24B.

Although embodiments of the inventive concepts have been described with reference to the accompanying drawings, those skilled in the art will appreciate that the inventive concepts may be embodied in other specific forms without changing the technical spirit or essential features of the inventive concepts. Accordingly, the above-described embodiments are to be considered as illustrative and not restrictive in any respect.

What is claimed is:

1. A memory device comprising:
a memory cell array including a plurality of memory cells connected to a plurality of bit lines and a plurality of word lines;
a first bit line sense amplifier electrically connected to a first memory cell from among the plurality of memory cells through a first bit line from among the plurality of bit lines and a first connecting wiring having a first length;
a first offset compensation transistor electrically connected to the first bit line and the first bit line sense amplifier;
a second bit line sense amplifier electrically connected to a second memory cell from among the plurality of memory cells through a second bit line from among the plurality of bit lines and a second connecting wiring having a second length different than the first length; and
a second offset compensation transistor electrically connected to the second bit line and the second bit line sense amplifier,
wherein the first bit line includes a first compensation load and the second bit line includes a second compensation load to equalize RC loads of the first bit line and the second bit line.

2. The memory device of claim 1, wherein the first compensation load and the second compensation load are configured to set a ratio of a turn-on resistance of the first offset compensation transistor and a turn-on resistance of the second offset compensation transistor corresponding to a reverse ratio of the first length and the second length.

3. The memory device of claim 2, wherein a ratio between a channel width of the first offset compensation transistor and a channel width of the second offset compensation transistor corresponds to the reverse ratio of the first length and the second length.

4. The memory device of claim 2, wherein a ratio of a channel length of the first offset compensation transistor and a channel length of the second offset compensation transistor corresponds to a ratio of the first length and the second length.

5. The memory device of claim 2, wherein a ratio of channel length per channel width of the first offset compensation transistor to channel length per channel width of the second offset compensation transistor corresponds to the reverse ratio of the first length and the second length.

6. The memory device of claim 2, wherein the first bit line sense amplifier is electrically connected to the first memory cell through a first complementary bit line from among the plurality of bit lines, and the second bit line sense amplifier is electrically connected to the second memory cell through a second complementary bit line from among the plurality of bit lines, the memory device further comprising:
a first complementary offset compensation transistor electrically connected to the first complementary bit line and the first bit line sense amplifier; and
a second complementary offset compensation transistor electrically connected to the second complementary bit line and the second bit line sense amplifier,
wherein the first complementary offset compensation transistor has a same turn-on resistance as the second complementary offset compensation transistor.

7. The memory device of claim 1, wherein the first bit line sense amplifier further comprises a first switch transistor connected in series to the first offset compensation transistor, and
the second bit line sense amplifier comprises a second switch transistor connected in series to the second offset compensation transistor, and
wherein the first compensation load and the second compensation load are configured to set a ratio of turn-on resistances of the first switch transistor and the second switch transistor corresponding to a reverse ratio of the first length and the second length.

8. The memory device of claim 7, wherein a channel width of the first switch transistor and a channel width of the second switch transistor correspond to a ratio of the first length and the second length.

9. The memory device of claim 7, wherein a ratio of a channel length of the first switch transistor to a channel length of the second switch transistor corresponds to the reverse ratio of the first length and the second length.

10. The memory device of claim 1, wherein the first bit line sense amplifier further comprises a first compensation transistor connected in series to the first bit line, and
the second bit line sense amplifier comprises a second compensation transistor connected in series to the second bit line, and
wherein the first compensation load and the second compensation load are configured to set a ratio of turn-on resistances between the first compensation transistor and the second compensation transistor corresponding to a reverse ratio of the first length and the second length.

11. The memory device of claim 10, wherein a channel width of the first compensation transistor and a channel width of the second compensation transistor correspond to a ratio of the first length and the second length.

12. The memory device of claim 10, wherein a ratio of channel length of the first compensation transistor and channel length of the second compensation transistor corresponds to the reverse ratio of the first length and the second length.

* * * * *